(12) United States Patent
Conklin et al.

(10) Patent No.: US 9,714,529 B1
(45) Date of Patent: Jul. 25, 2017

(54) MOUNTING SYSTEM FOR SECURING OF DEVICES IN A CEILING OR TO A WALL

(71) Applicants: Rick Conklin, Bellefonte, PA (US); Scott Thompson, State College, PA (US)

(72) Inventors: Rick Conklin, Bellefonte, PA (US); Scott Thompson, State College, PA (US)

( * ) Notice: Subject to any disclaimer, the term of this patent is extended or adjusted under 35 U.S.C. 154(b) by 0 days.

(21) Appl. No.: 14/192,134

(22) Filed: Feb. 27, 2014

Related U.S. Application Data

(60) Provisional application No. 61/770,389, filed on Feb. 28, 2013.

(51) Int. Cl.
*F16M 13/00* (2006.01)
*E05B 73/00* (2006.01)
*H05K 5/02* (2006.01)

(52) U.S. Cl.
CPC ....... *E05B 73/0082* (2013.01); *H05K 5/0221* (2013.01)

(58) Field of Classification Search
CPC ... E05B 73/0082; A47B 95/008; G06F 1/187; H05K 5/0208; H05K 5/0221; H05K 7/1407
USPC ........... 248/551, 553, 220.21, 220.22, 224.8, 248/222.41, 343; 70/167, 170, 38, 163, 70/166, 171; 312/245, 246; 292/137, 292/156, 159, 140, 300, 302, 341.15; 361/679.39, 679.57, 679.43, 679.58, 726, 361/732, 747
See application file for complete search history.

(56) References Cited

U.S. PATENT DOCUMENTS

| | | | | |
|---|---|---|---|---|
| 4,158,337 A * | 6/1979 | Bahry | ..................... | E05G 1/026 109/59 R |
| 4,502,656 A * | 3/1985 | Zeitler | ................. | F16M 11/041 248/346.03 |
| 4,603,829 A * | 8/1986 | Koike | ..................... | B60R 11/00 248/553 |
| 4,893,777 A * | 1/1990 | Gassaway | ........... | E05B 73/0082 211/8 |
| 5,013,000 A * | 5/1991 | Gassaway | ........... | E05B 73/0082 211/8 |
| 5,116,015 A * | 5/1992 | Gassaway | ........... | E05B 73/0082 248/205.1 |
| 5,255,811 A * | 10/1993 | Simon | .................. | A01K 63/006 119/265 |
| 6,606,887 B1 * | 8/2003 | Zimmer | .............. | E05B 73/0082 70/14 |
| 8,235,349 B1 * | 8/2012 | Conklin | ............... | F16M 13/027 109/50 |
| 2004/0211872 A1 * | 10/2004 | Dittmer | ................ | F16M 11/041 248/323 |

(Continued)

*Primary Examiner* — Christopher E Garft
(74) *Attorney, Agent, or Firm* — John Elnitski, Jr.

(57) ABSTRACT

A mounting system for securing a device that includes a base. The base having at least one lock hole which leads from an outside surface to an inside surface. There is at least one guide pin extending out from the base and a lock plate. The lock plate including at least one guide slot and at least one lock slot. There is a lock plate actuator connected to the lock plate to move the lock plate along the at least one guide pin. There is device receiver plate with at least one lock pin to engage one of the lock slots during movement of the lock plate along the guide pins to secure the device receiver plate to the base.

15 Claims, 33 Drawing Sheets

(56) References Cited

U.S. PATENT DOCUMENTS

| | | | |
|---|---|---|---|
| 2007/0257181 A1* | 11/2007 | Dittmer | F16M 11/041 248/637 |
| 2009/0021653 A1* | 1/2009 | Kerr | E05B 73/0082 348/836 |
| 2011/0297809 A1* | 12/2011 | Bouissiere | F16M 11/043 248/274.1 |
| 2012/0305727 A1* | 12/2012 | Bouissiere | F16M 11/041 248/309.1 |

* cited by examiner

MOUNTING SYSTEM FOR SECURING OF DEVICES IN A CEILING OR TO A WALL

This application claims the benefit of and incorporates by reference U.S. Provisional Application No. 61/770,389 filed Feb. 28, 2013.

BACKGROUND

The present invention generally relates to the use of electronic devices mounted in ceilings and walls for wireless communication. More specifically, the present invention relates to an apparatus that mounts in a ceiling or wall and secures an electronic device within the ceiling or against a wall.

Commonly, the wireless equipment such as an access point or telemetry gateway is mounted on a desk top, attached to a wall, suspended from an acoustical tile ceiling gridwork, or placed above the acoustical tile ceiling. These methods of mounting do not physically secure the equipment, and do not provide for ease of installation and maintenance. Since the wireless equipment commonly has an antenna, the equipment must be mounted in such a way that the equipment and antenna is exposed to the room, so that the radio frequency may propagate into the room to be covered by the equipment. Such wireless equipment has become very popular for computer networking in schools, factories, public buildings and office buildings. A main part of a wireless system for a computer network is an access point. The access point is the unit which communicates directly with wireless devices carried by users. Access points are usually mounted in the ceilings of buildings to avoid the ugly look of the wires required to be hooked to the access point. The access point is an expensive piece of equipment which can be easily stolen from the ceiling of a building. Access points can be a variety of shapes and sizes, which depends on the manufacturer of the access point. The different shapes and sizes present a problem to finding a way to universally secure an access point in the ceiling or to a wall.

It is an object of the present invention to provide an apparatus that provides for secure mounting of an access point in a ceiling or to a wall, as well as other devices which could be mounted in a ceiling or to a wall.

SUMMARY OF THE INVENTION

A mounting system for securing a device that includes a base. The base having an inside surface and an outside surface, at least one lock hole which leads from the outside surface to the inside surface, and the base adapted to be mounted in a location. The mounting system includes at least one guide pin extending out from the base and a lock plate mounted in relation to the base such that the lock plate moves along the inside surface of the base, the lock plate including at least one guide slot and at least one lock slot, each of the at least one guide slot engaging each of the at least one guide pin to guide movement of the lock plate along the inside surface of the base, each of the lock slot aligning with one of the lock hole of the base. The mounting system includes a lock plate actuator connected to the lock plate to move the lock plate along the at least one guide pin, the lock plate actuator having access to be manipulated from the outside surface of the base and a device receiver plate having a device side and a lock plate side, the device side adapted for mounting to a device so that the device can be secured to the mounting system. The mounting system includes at least one lock pin extending from the lock plate side of the device receiver plate, each of the at least one lock pin being long enough to pass through one of the lock hole of the base and engage one of the lock slot when the lock plate side of the device receiver plate is mounted against the outside surface of the base; and the lock slot movable along the lock pin during movement of the lock plate along the guide pin such that movement in one direction of the lock plate by the lock plate actuator secures the device receiver plate to the outside surface of the base and movement of the lock plate along the guide pin in another direction allows for attachment and release of the device receiver plate at the outside surface of the base.

DETAILED DESCRIPTION

Figure 1:
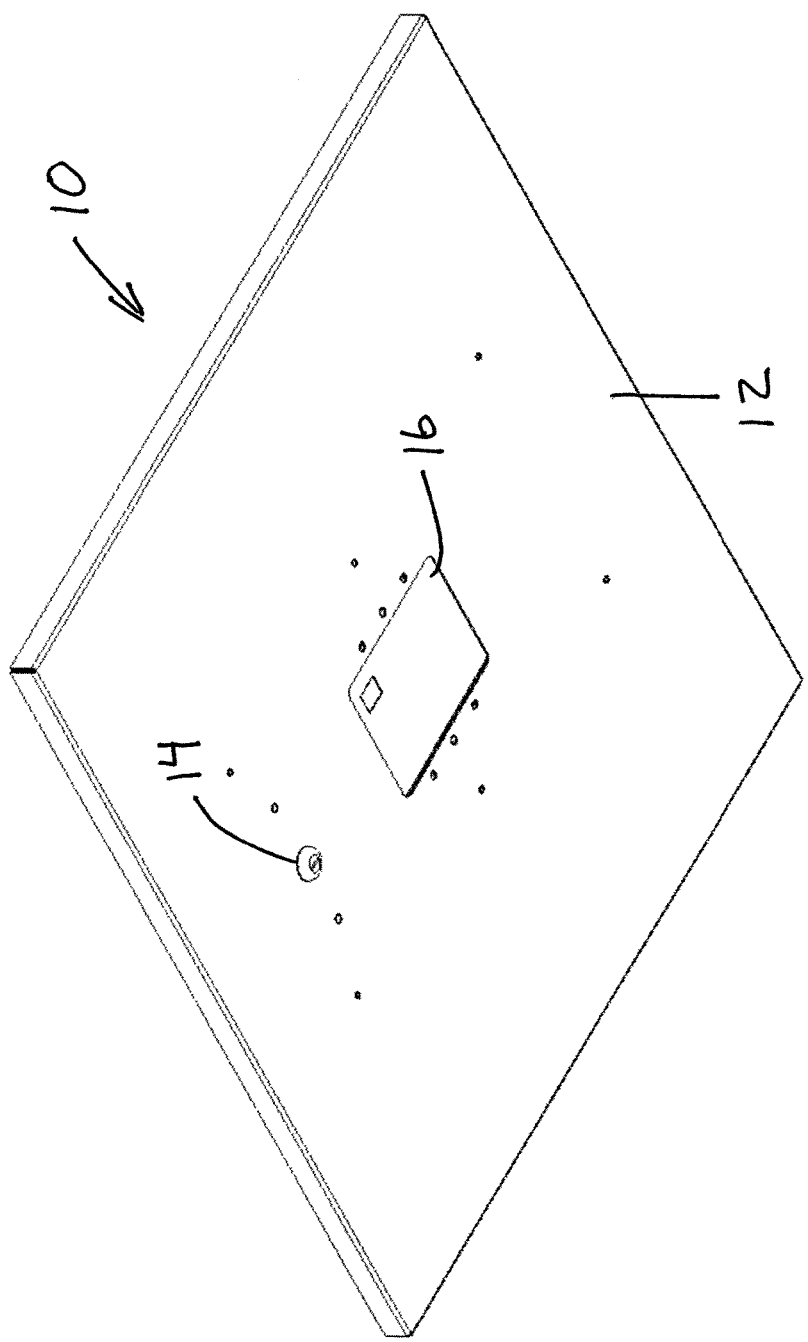
FIG. 1 is an outside perspective view of a ceiling embodiment according to the present invention.
Figure 2:
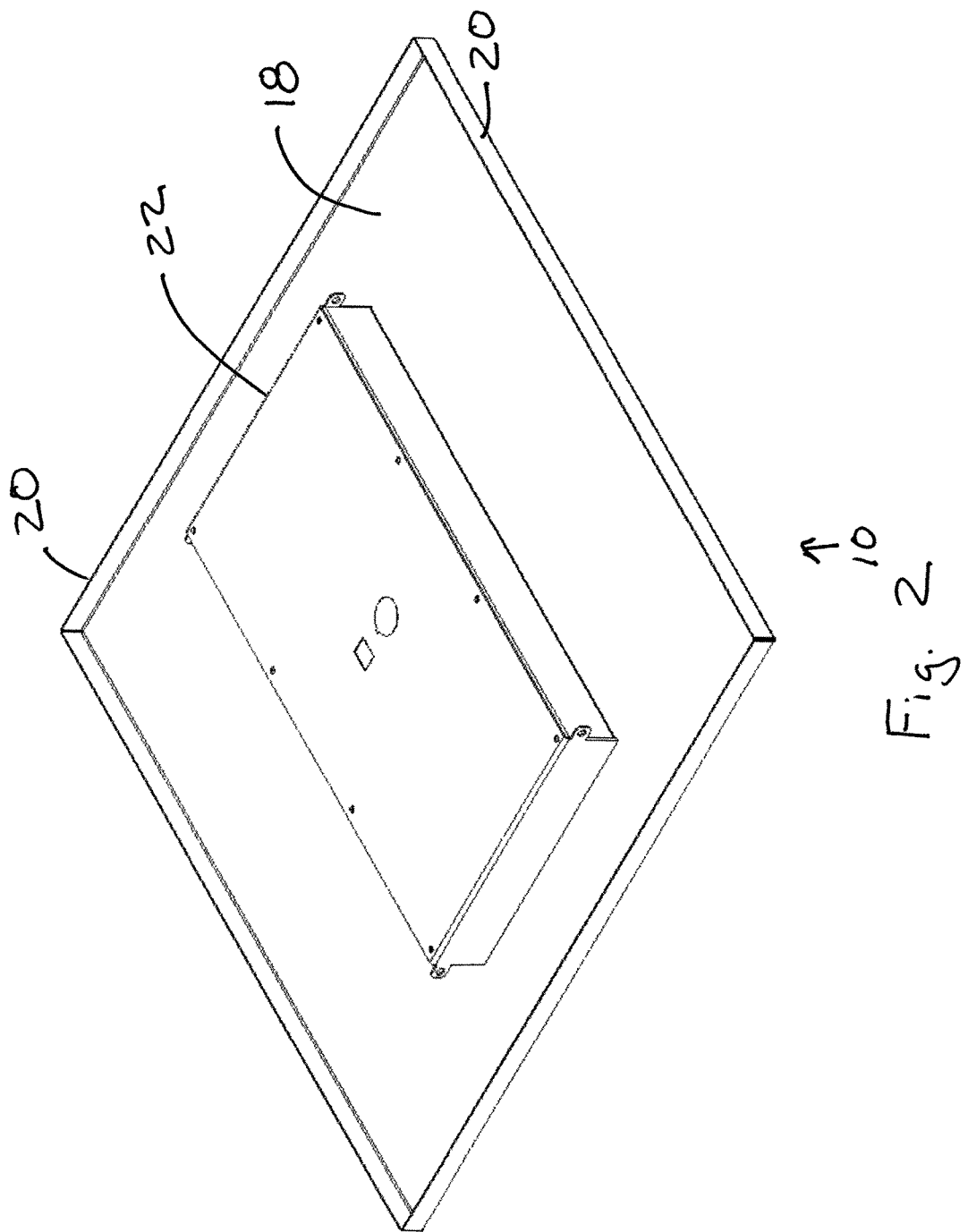
FIG. 2 is an inside perspective view of a ceiling embodiment according to the present invention.

The present invention is a mounting system to secure a device to a ceiling or to a wall of a building, as shown in FIGS. 1-33. FIGS. 1-16 show a ceiling embodiment. FIG. 1 shows a base 10, which acts as a ceiling tile. FIG. 1 shows the bottom of the base 10, which faces into the room of a building. The base 10 is usually sized and shaped to be a replacement for a ceiling tile used in a suspended ceiling system, but can be sized and shaped to simulate other types of ceilings. The base 10 in FIG. 1 is shown as a square, but could be any shape, depending on the shape of the ceiling tiles used in the suspended ceiling system. Generally, suspended ceiling systems use a grid of supports which hold tiles within the supports. The base 10 of FIG. 1 is shown where the bottom of the base 10 is an outside surface 12 of the base 10, which faces toward the inside of a room of a building when installed into the suspended ceiling system. The outside surface 12 is usually covered or painted to match the décor of the room, as it is seen by people in the room. Seen from the outside surface 12 of the base are a lock 14 and a device receiver plate opening 16. FIG. 2 shows an inside surface 18 of the base 10 with sides 20 extending upward from the inside surface 18. The base 10 can be secured in one of the open grids of a suspended ceiling system in a number of known methods, so that the base 10 cannot be removed without getting in between the roof and the suspended ceiling and using tools for the removal of the base 10 from the grid. The sides 20 of the base 10 can be used as part of the means of securing the base 10 in the open grid. FIG. 2 shows a secure cover 22 attached to the inside surface 18 of the base 10.

Figure 3:
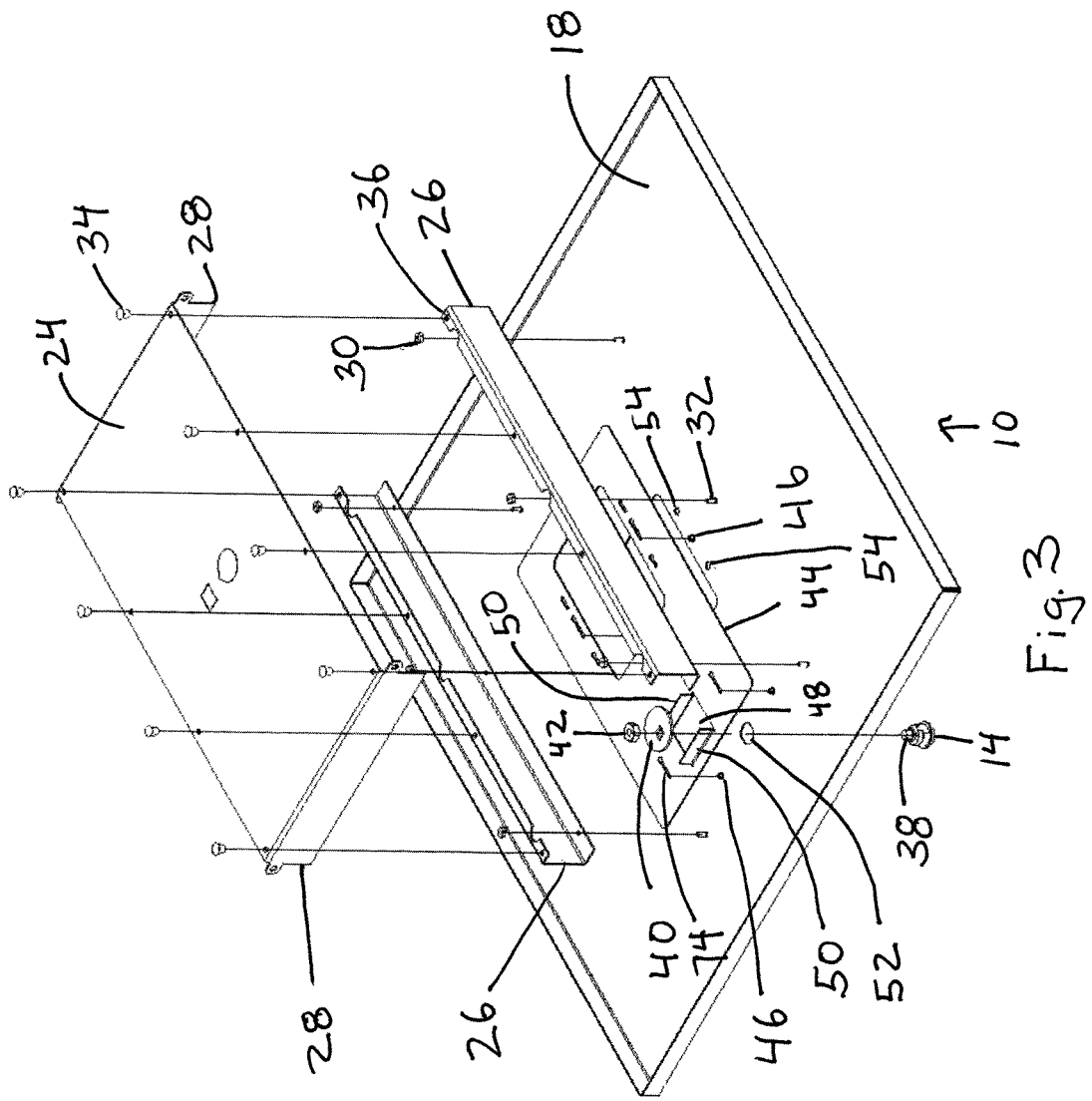
FIG. 3 is an inside exploded view of a ceiling embodiment according to the present invention.

FIG. 3 shows an exploded view of the components of the secure cover 22. The secure cover 22 includes a top plate 24 and two cover sides 26. The top plate 24 includes two ends 28 extending down from the top plate 24. The two ends 28 of the top plate 24 extend downward towards the inside surface 18 of the base 10. The cover sides 26 are secured to the inside surface 18 of the base 10 using nuts 30 and threaded studs 32 extending upward from the inside surface 18. The top plate 24 is screwed to the cover sides 26 using screws 34 and screw holes 36 of both the cover plate 24 and cover sides 26 which align with each other. Together the cover plate 24 and cover sides 26 enclose the other components attached to the base 10. FIG. 3 also shows the lock 14, a lock stud 38, a cam plate 40, a nut 42, a lock plate 44 and guide pins 46. The lock plate 44 includes a cam plate opening 48 and two cam tabs 50. The lock 14 acts as a key receiver and attaches to the base 10 through a lock hole 52. The lock 14 is to be accessed from the outside surface 12 with a key. The lock stud 38 extends up through the cam plate opening 48 and between the cam tabs 50. The lock stud 38 is rotated by turning the key in the lock 14. The cam plate 40 is attached to the lock stud 38 using the nut 42. Together the lock 14, lock stud 38, cam plate 40, nut 42 and cam tabs 50 act as a lock plate actuator to move the lock plate 44. FIG. 3 also shows lock holes 54 in the base 10.

Figure 4:
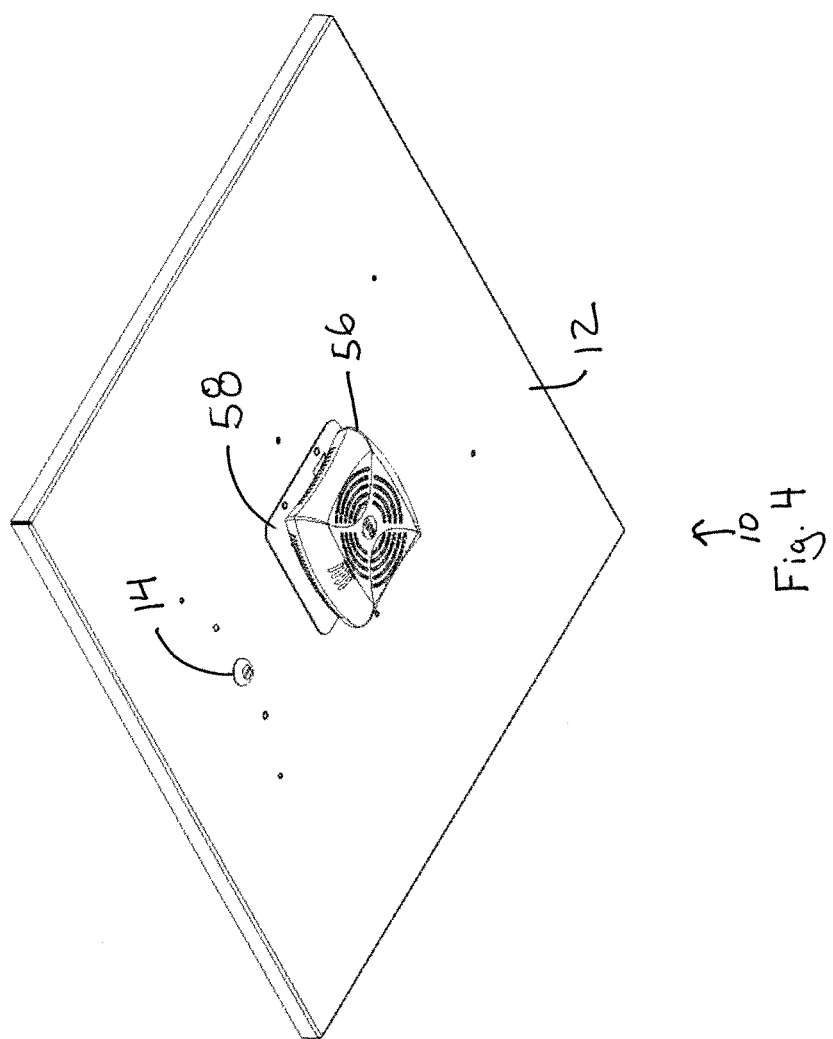
FIG. 4 is an outside perspective view of a ceiling embodiment according to the present invention.
Figure 5:
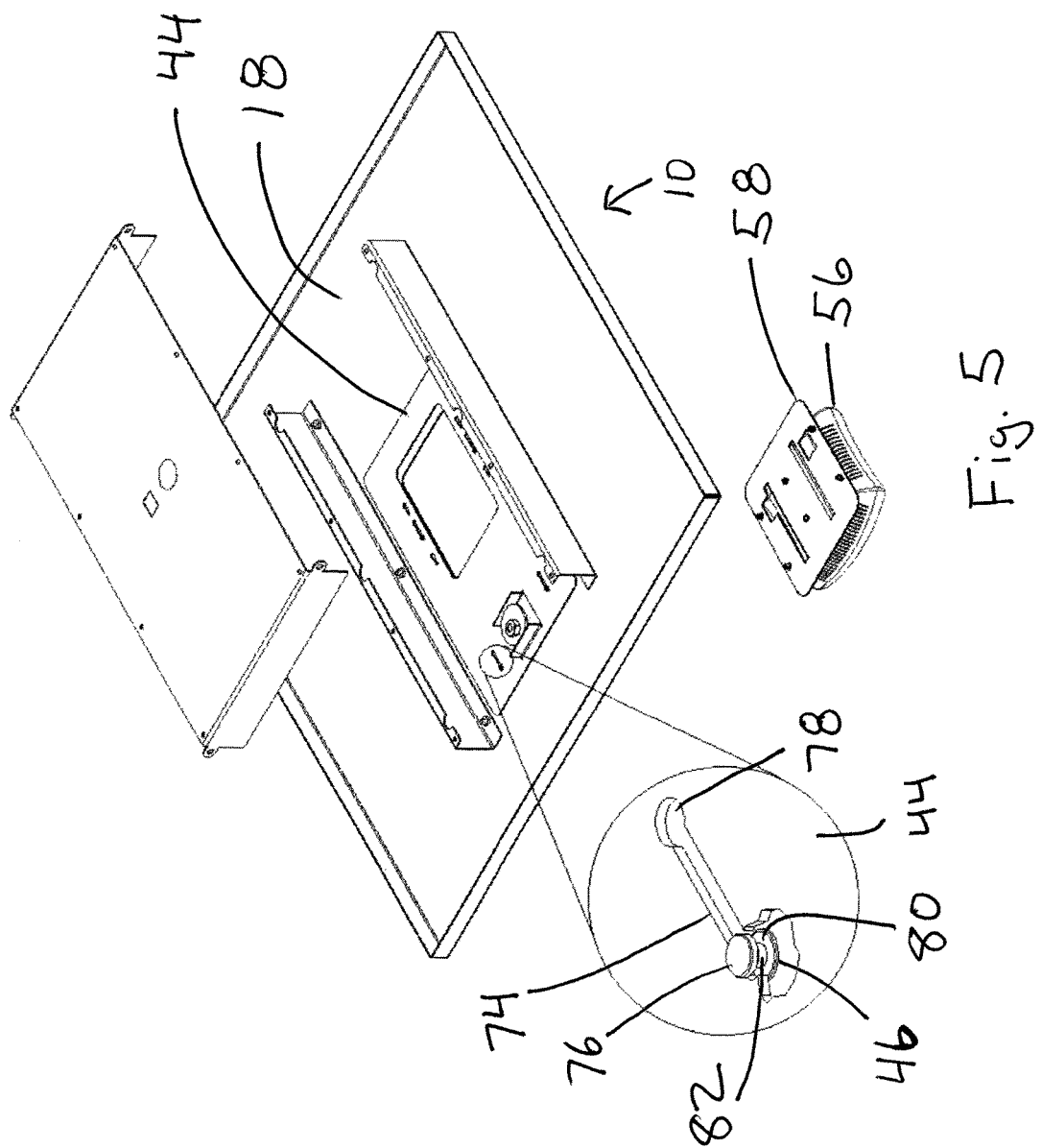
FIG. 5 is an inside exploded view of a ceiling embodiment according to the present invention.
Figure 6:
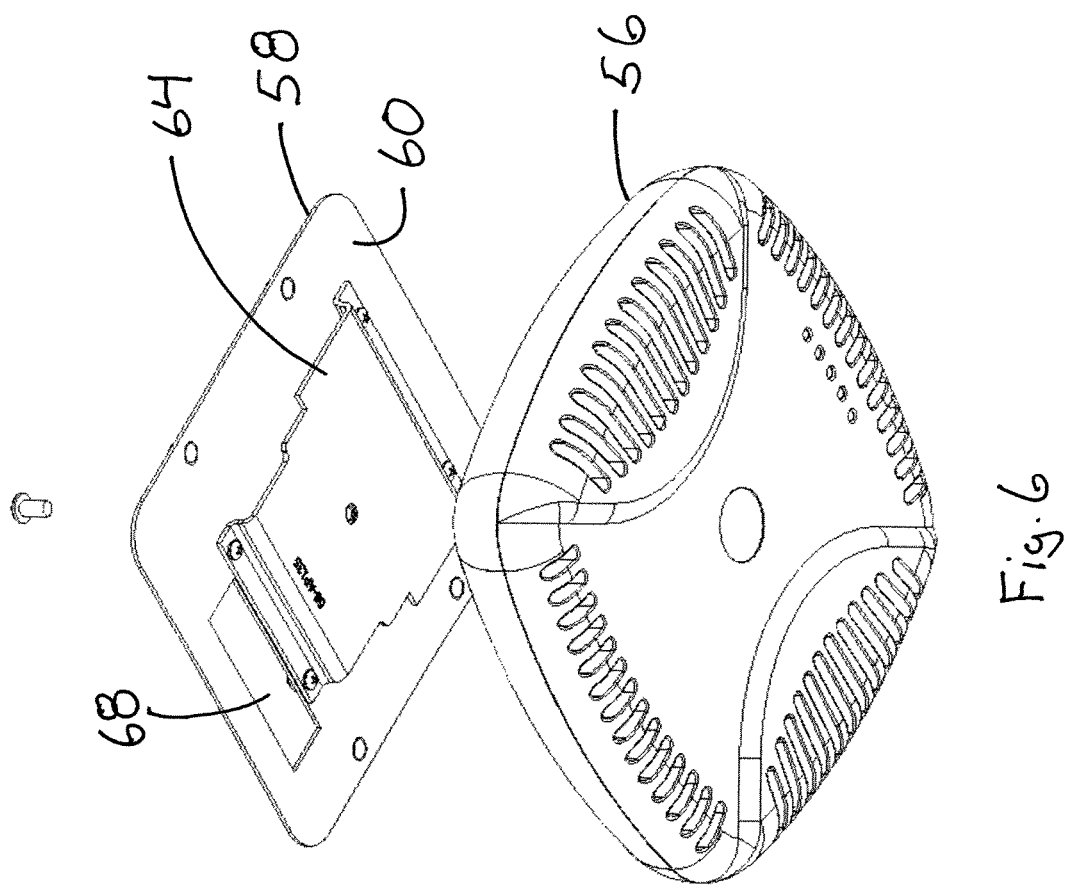
FIG. 6 is a perspective view of a receiver plate according to the present invention.
Figure 7:
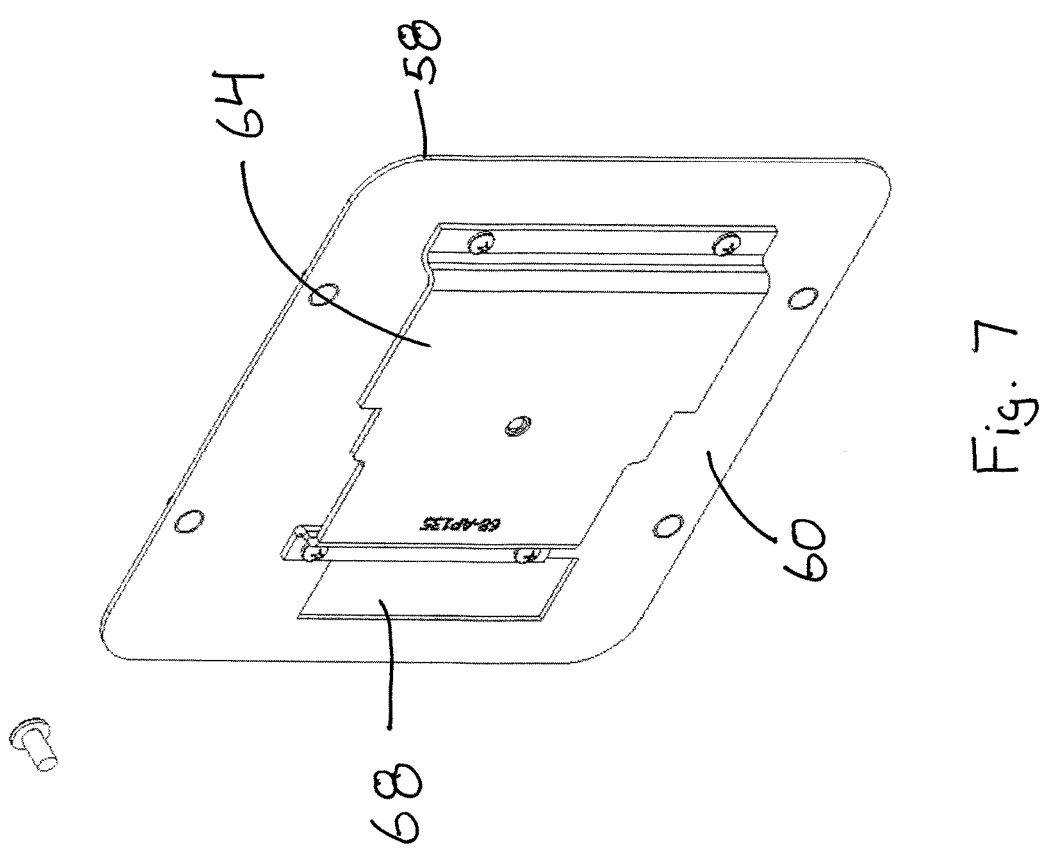
FIG. 7 is a perspective view of a receiver plate according to the present invention.
Figure 8:
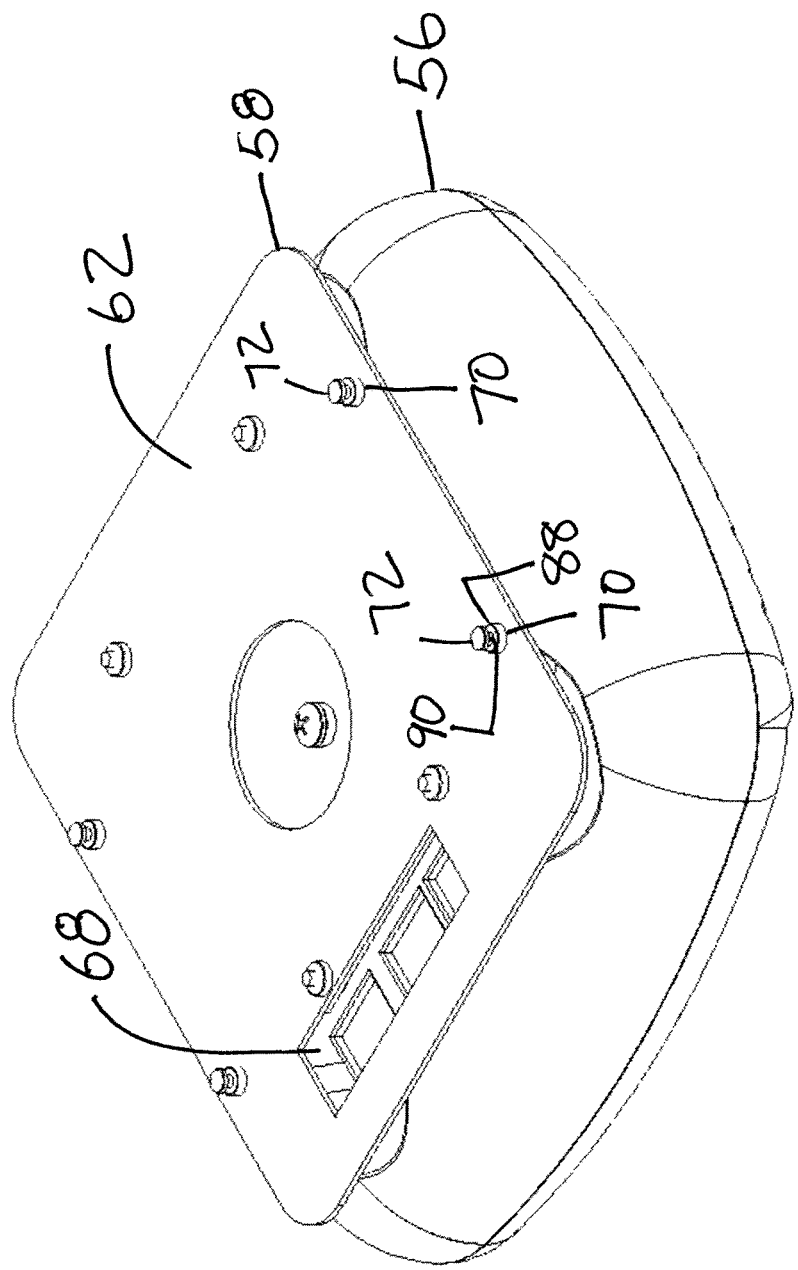
FIG. 8 is a perspective view of a receiver plate according to the present invention.
Figure 9:
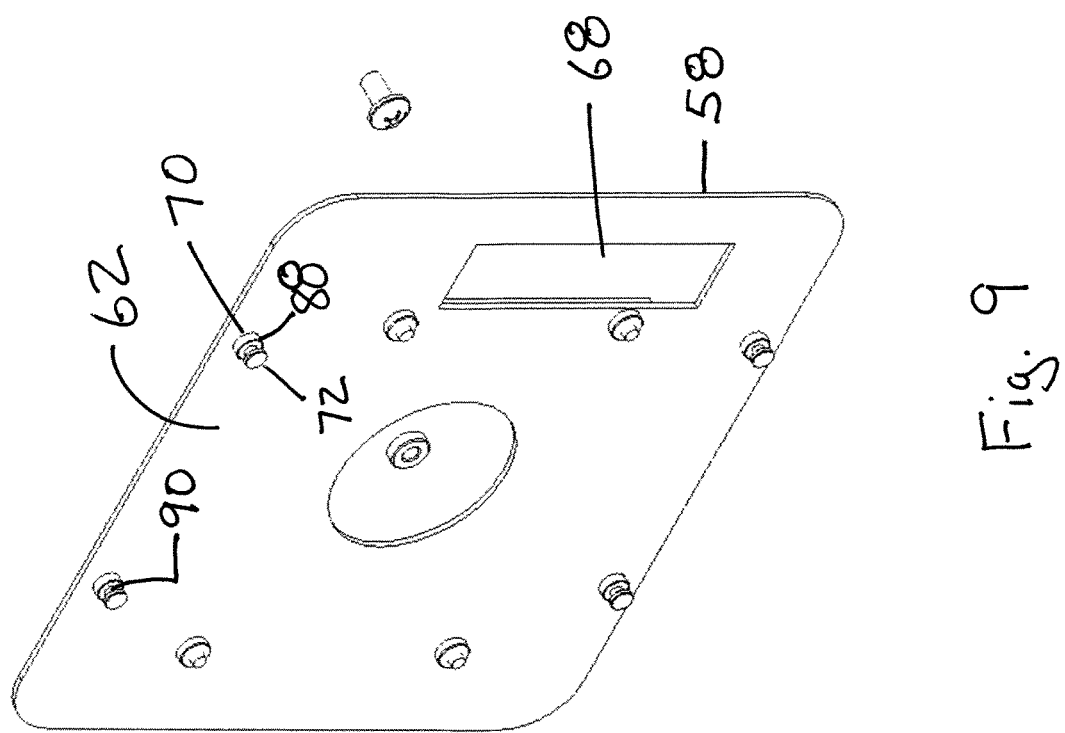
FIG. 9 is a perspective view of a receiver plate according to the present invention.

FIG. 4 shows a device 56 attached to the mounting system of the first embodiment and extending outward for the outside surface 12 of the base 10. The device 56 is attached to a device receiver plate 58. FIG. 5 shows the device 56 attached to the device receiver plate 58 and exploded away from the base 10. The device receiver plate 58 has a device side 60 and a lock plate side 62. FIGS. 6-7 show the device side 60 of the device receiver plate 58. The device receiver plate 58 includes a device mount 64. The device mount 64 is attached to the device receiver plate 58 using a fastener, such as screws. The device mount 64 is made to mount properly to the particular device to be used, as devices are not universal. Therefore, the device mount 64 is the only part of the mounting system that has to be made specifically to fit the device 56. Thereby, allowing the other parts of the mounting system can be universal to the mounting of any device 56. The device receiver plate 58 includes a wire opening 68 to allow any needed wires from the device 56 to pass through. FIGS. 8-9 show the lock plate side 62 of the device receiver plate 58. The lock plate side 62 includes lock pins 70 extending out from the lock plate side 62. The lock pins 70 include a lock pin head 72 to aid in securing the device receiver plate 58 to the base 10.

Figure 10:
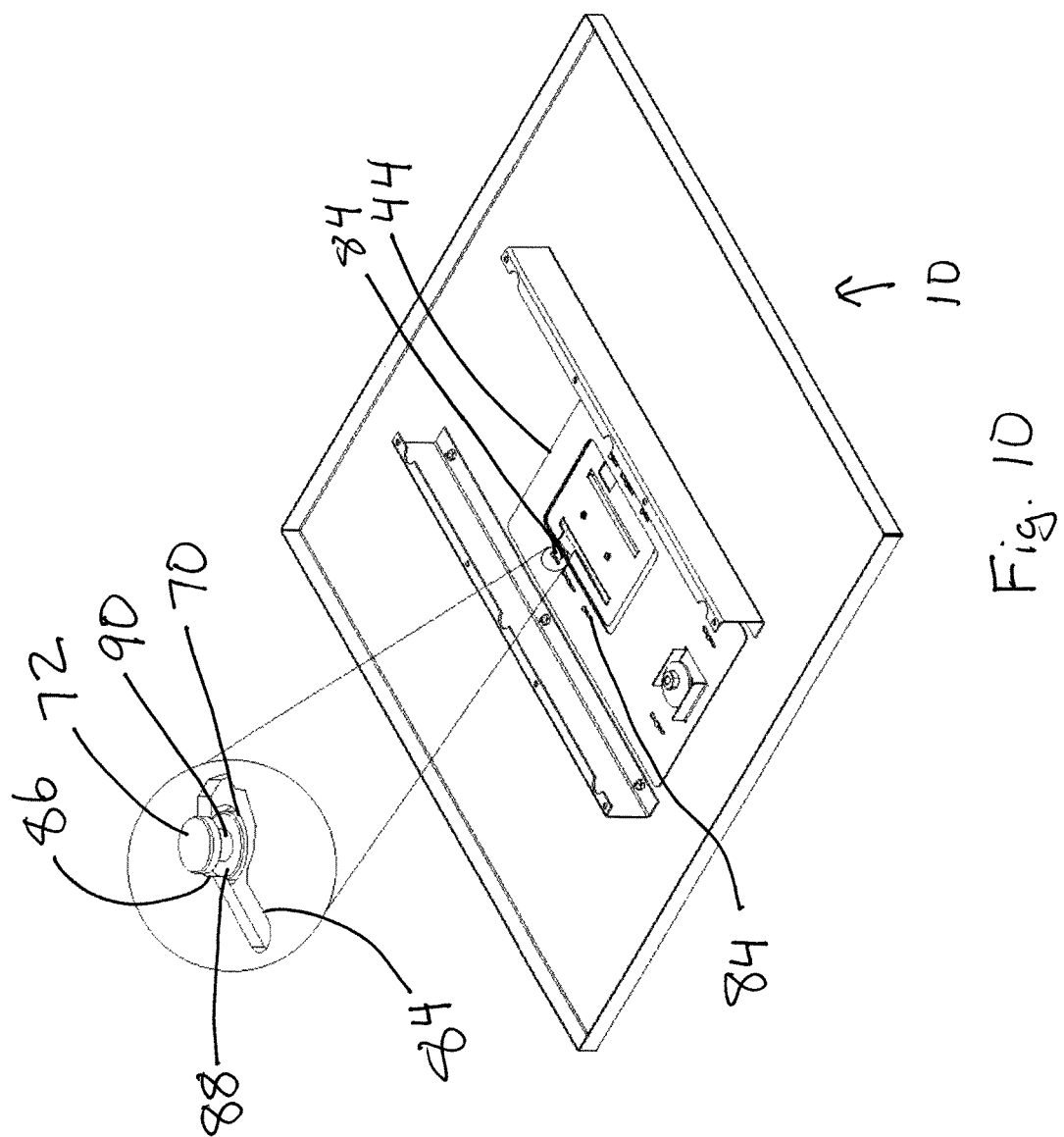
FIG. 10 is an inside perspective view of a ceiling embodiment according to the present invention.
Figure 11:
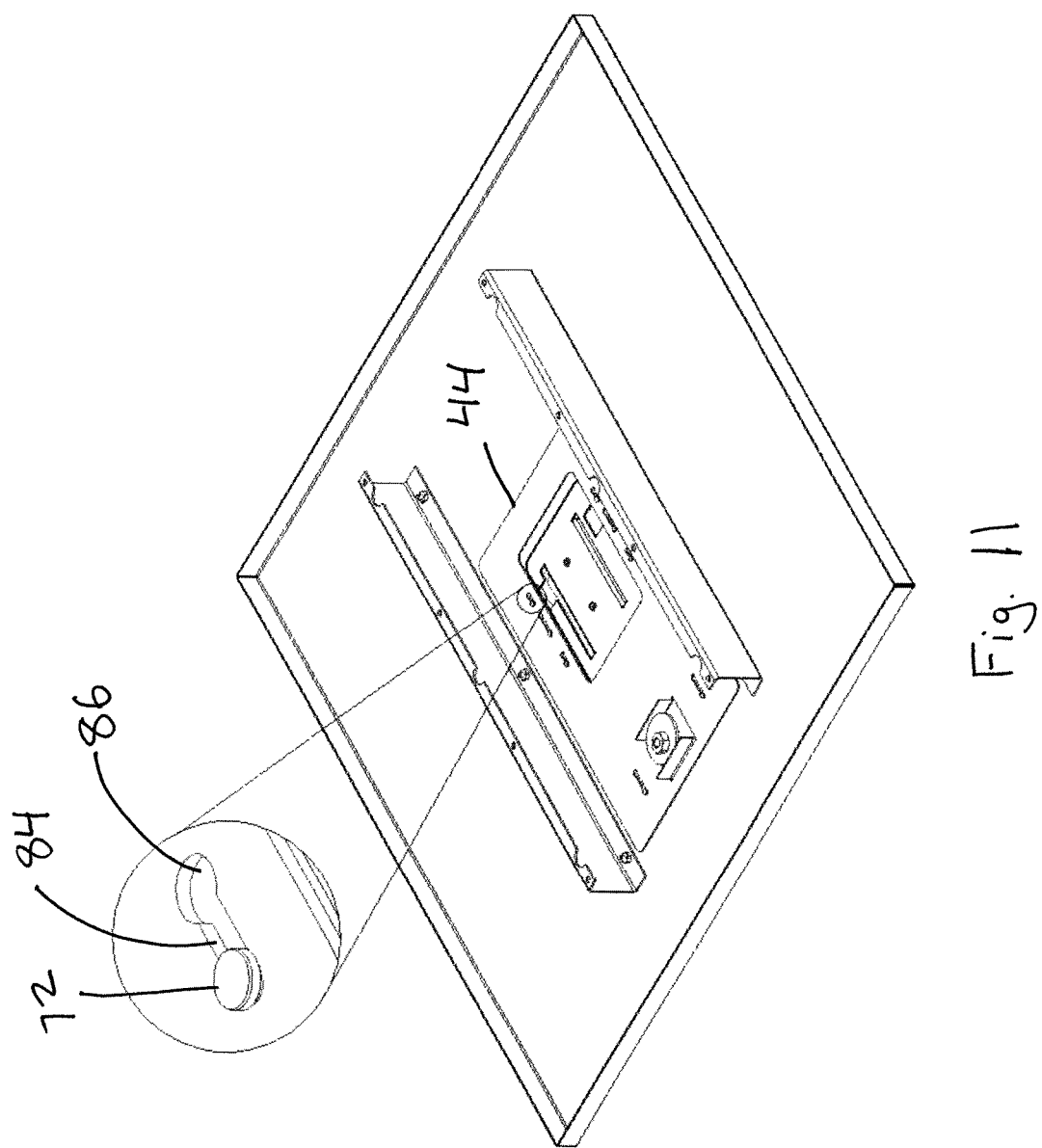
FIG. 11 is an inside perspective view of a ceiling embodiment according to the present invention.

As shown in FIG. 5, the lock plate 44 includes guide slots 74 to receive the guide pins 46 of the base 10. The lock plate 44 mounts over the guide pins 46 and slides along the guide pins 46. The guide pins 46 provide for uniform movement of the lock plate 44 forward and backward. The guide pins 46 are shown with guide pin heads 76 that fit in a head opening 78, which is a round hole at the end of each guide slot 74. The guide pin head 76 is larger than the guide pin 46 that fits into the guide slot 74, such that the guide pin 46 does not fall from the guide slot 74 due to the guide pin head 76 riding above the lock plate 44 around the guide slot 74. The guide pin 46 includes a shoulder 80 and a guide shaft 82. The guide shaft 82 extends up from the shoulder 80 and supports the guide pin head 76. The lock plate 44 rides on the shoulder 80 and the guide shaft 82 runs along the guide slot 74. The lock plate 44 also includes lock pin slots 84 with a head hole 86 at the end of the lock pin slots 84. The round head hole 86 of the lock pin slots 84 is a head opening to allow the lock pin head 72 of the lock pins 70 from the device receiver plate 58 to pass, as shown in FIG. 10. Movement of the lock plate 44 rearward caused the lock pin slots 84 to move along the lock pins 70 and under the lock pin head 72 of the lock pin 70, as shown in FIG. 11. The lock pin slots 84 hold the lock pins 70 in place by trapping the lock pin head 72 of the lock pin 70 above the lock plate 44. Holding the lock pin 70 in place secures the device receiver plate 58 to the base 10 and hence secures the device 56 to the base 10. The lock pin 70 includes a shoulder 88 and a guide shaft 90. The guide shaft 90 extends up from the shoulder 88 and supports the lock pin head 72. The lock plate 44 rides on the shoulder 88 and the guide shaft 90 runs along the lock slot 84.

Figure 12:
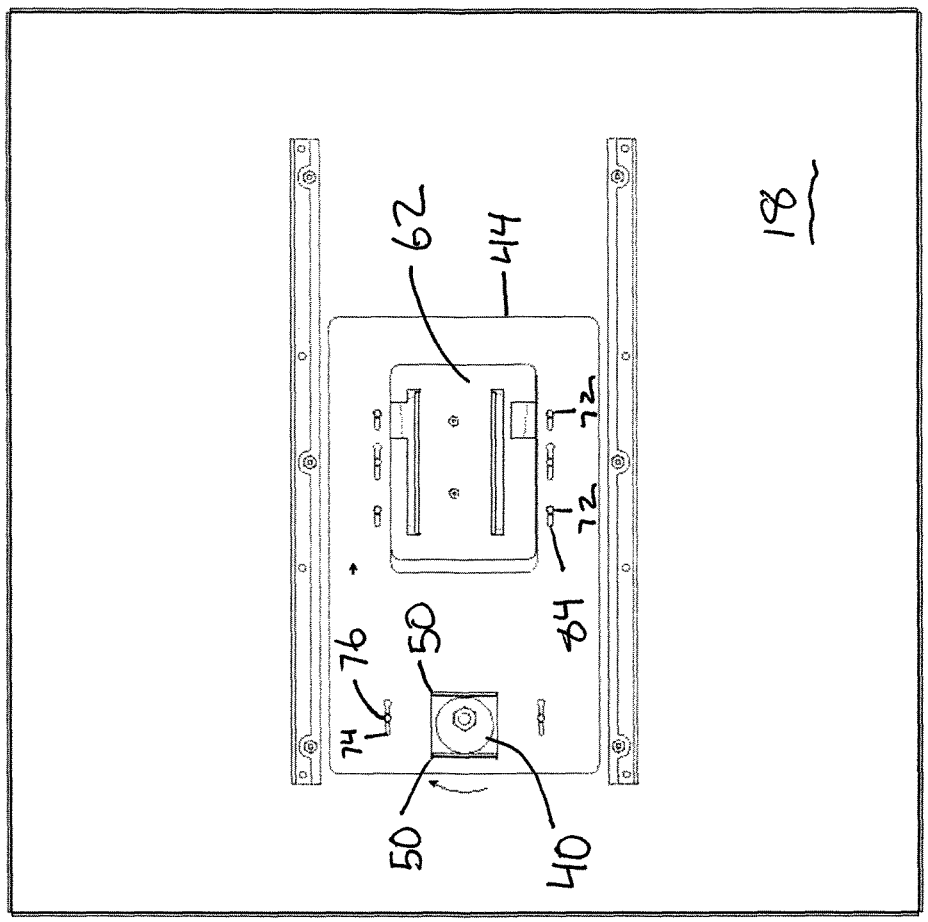
FIG. 12 is a top view of a ceiling embodiment according to the present invention.
Figure 13:
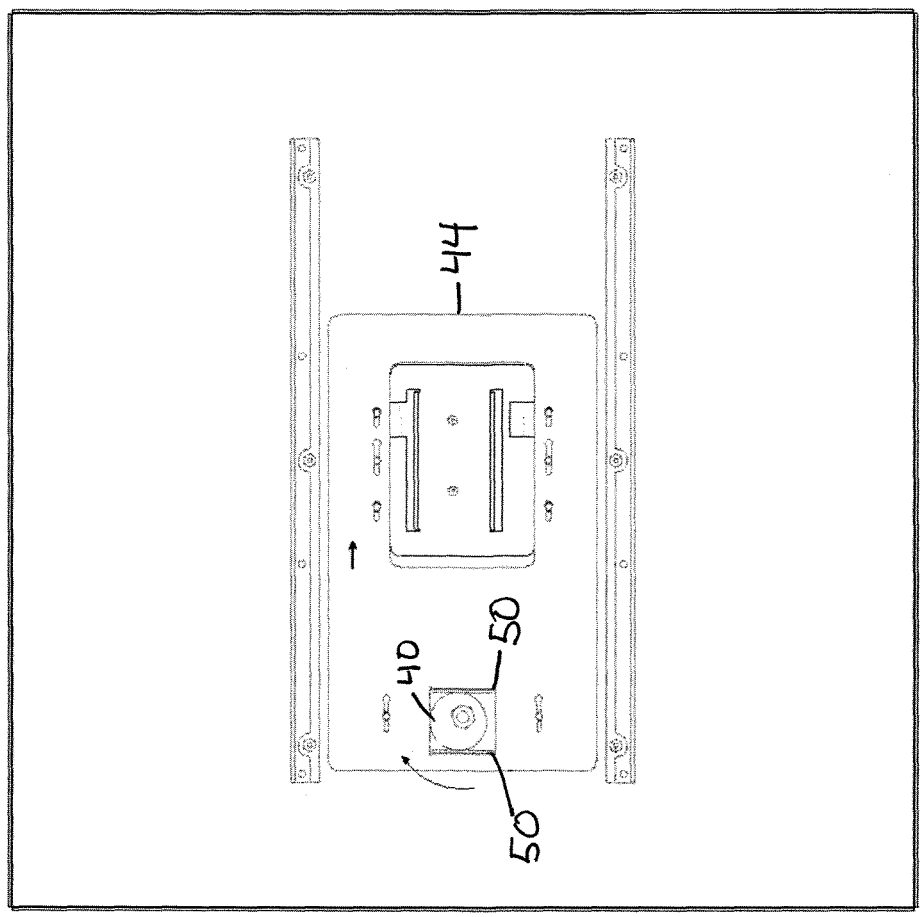
FIG. 13 is a top view of a ceiling embodiment according to the present invention.
Figure 14:
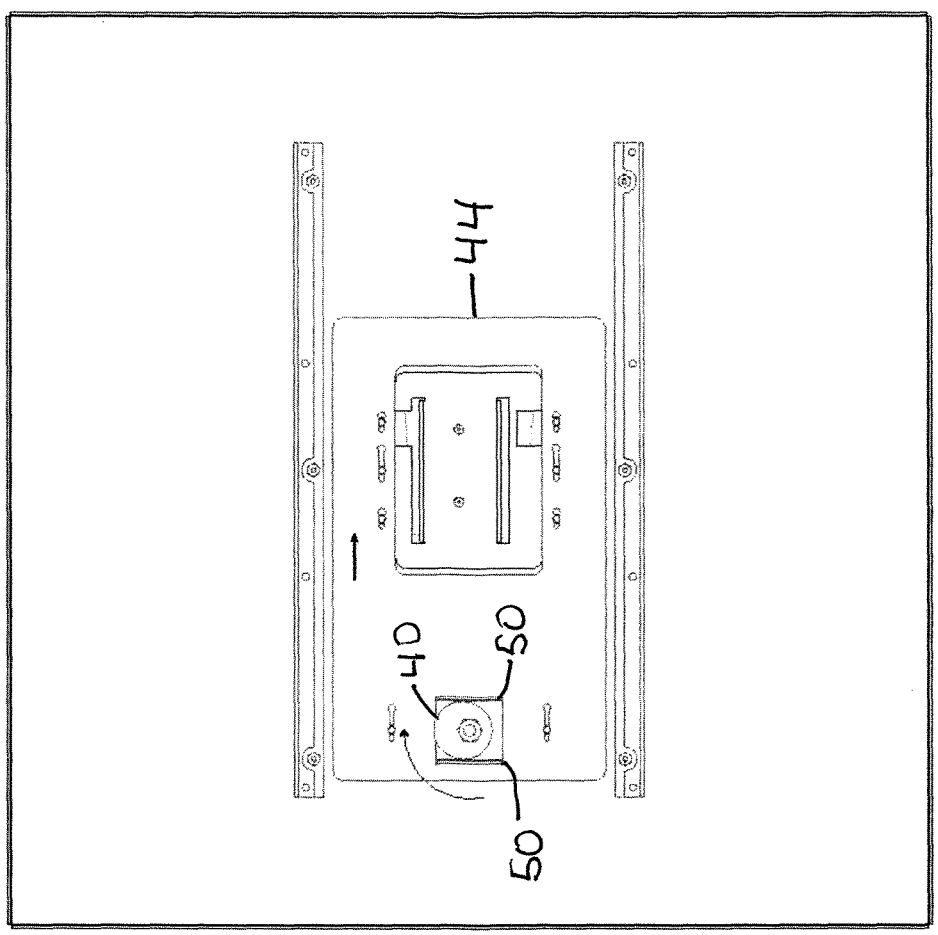
FIG. 14 is a top view of a ceiling embodiment according to the present invention.
Figure 15:
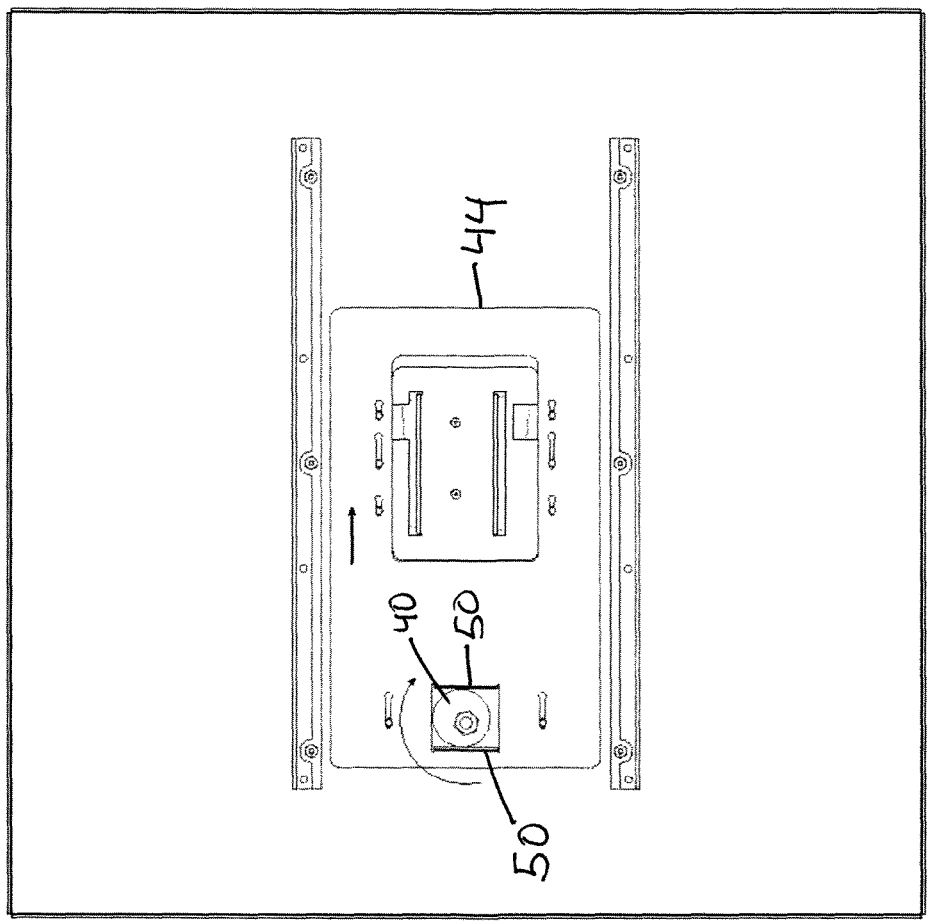
FIG. 15 is a top view of a ceiling embodiment according to the present invention.
Figure 16:
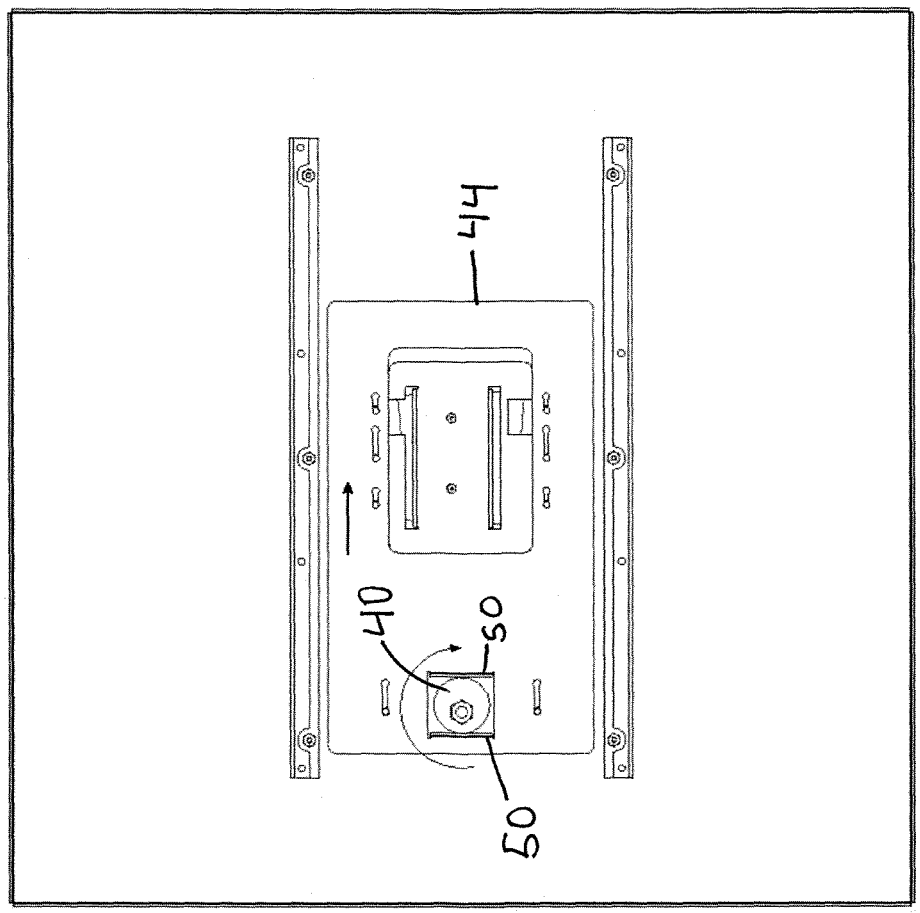
FIG. 16 is a top view of a ceiling embodiment according to the present invention.

FIGS. 12-16 show how the lock 14 works with the lock plate 44 to secure the device receiver plate 58 with the device 56 to the base 10. FIG. 12 shows the mounting system in the unlocked position. In the unlocked position, the lock pin heads 72 of the lock pins 70 are placed through the lock holes 54 of the base 10 from the outside surface 12 and into the head holes 86 of the lock plate 44. The cam plate 40 is against the forward cam tab 50. The cam plate 40 is shaped such that if part of the cam plate 40 is against one of the cam tabs 50, the cam plate 40 does not engage the other cam tab 50. Rotation of a key in the lock 14 rotates the lock stud 38 and hence the cam plate 40. FIGS. 13-15 show the larger part of the cam plate 40 rotating away from the forward cam tab 50 and toward the rearward cam tab 50. As the larger part of the cam plate 40 rotates toward the rear cam tab 50, the cam plate 40 pushes the lock plate 44 rearward. While the device 56 with device receiver plate 58 is under the device receiver plate opening 16, the movement of the lock plate 44 rearward causes the lock pin slots 84 to engage the lock pins 70 and hold the device receiver plate 58 in place. FIG. 16 shows the larger part of the cam plate 40 against the rear cam tab 50. When the cam plate 40 is against the rear cam tab 50, the lock plate 44 is in the full lock position and the key of the lock 14 can be removed. Once the key is removed, the device 56 cannot be removed without the use of the key.

Figure 17:
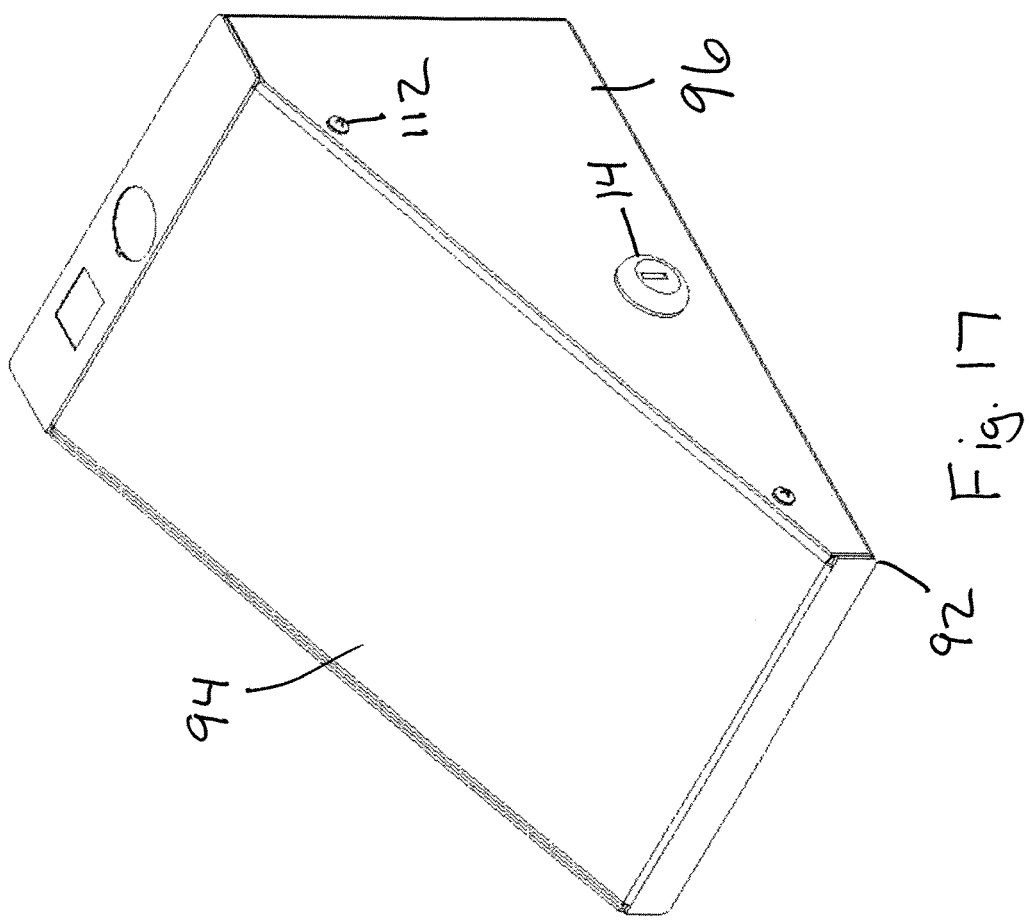
FIG. 17 is an outside perspective view of a wall embodiment according to the present invention.
Figure 18:
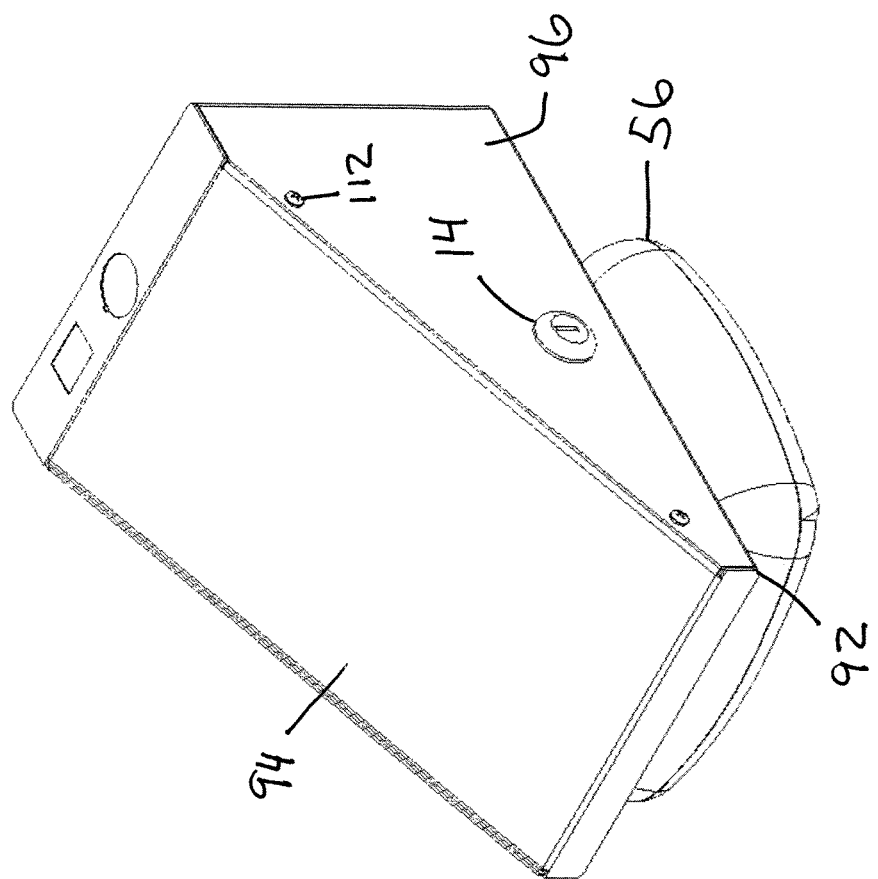
FIG. 18 is an outside perspective view of a wall embodiment according to the present invention.
Figure 19:
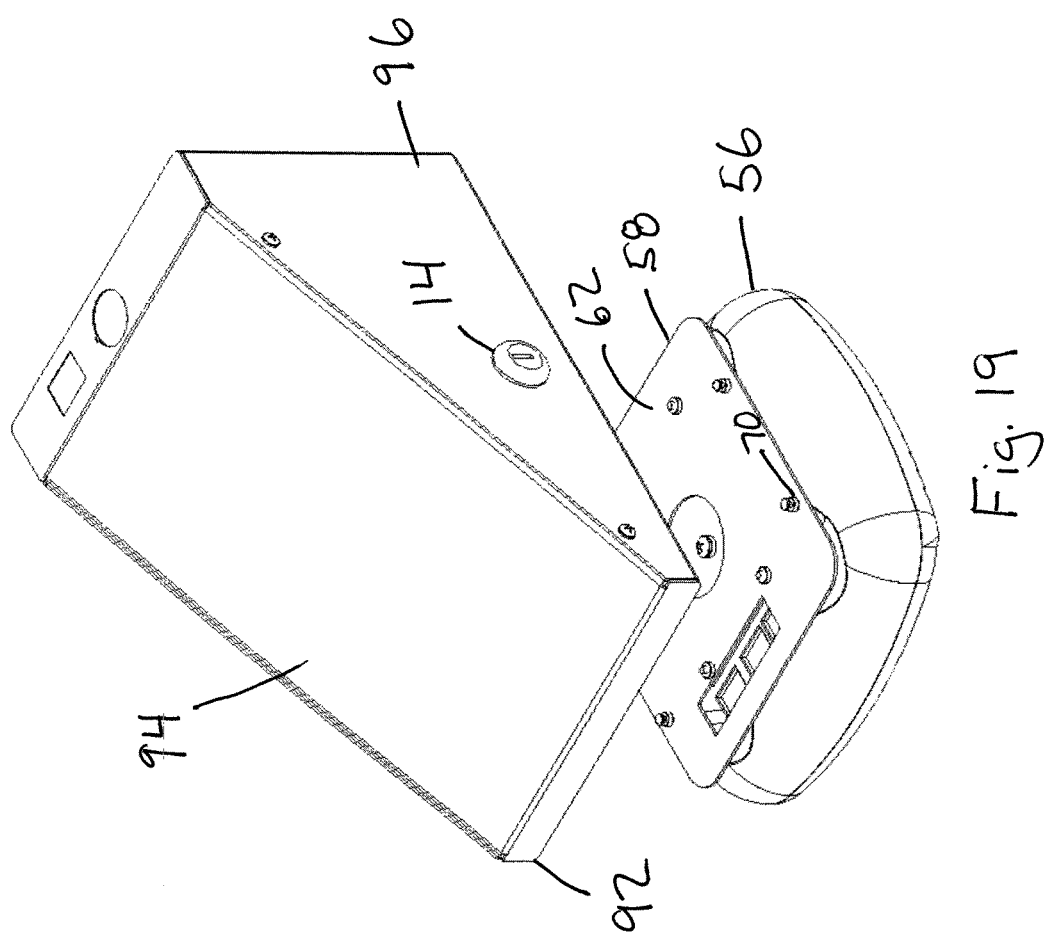
FIG. 19 is an outside perspective view of a wall embodiment according to the present invention.
Figure 20:
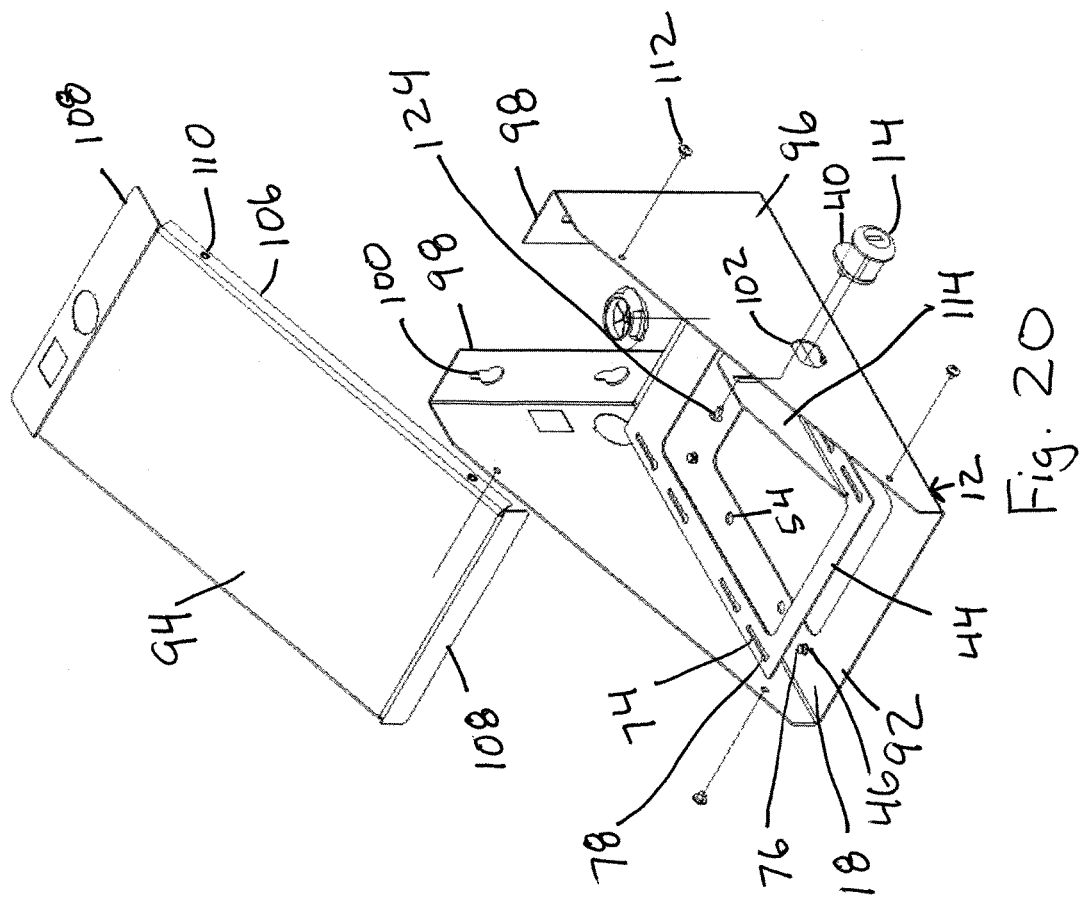
FIG. 20 is an exploded view of a wall embodiment according to the present invention.
Figure 21:
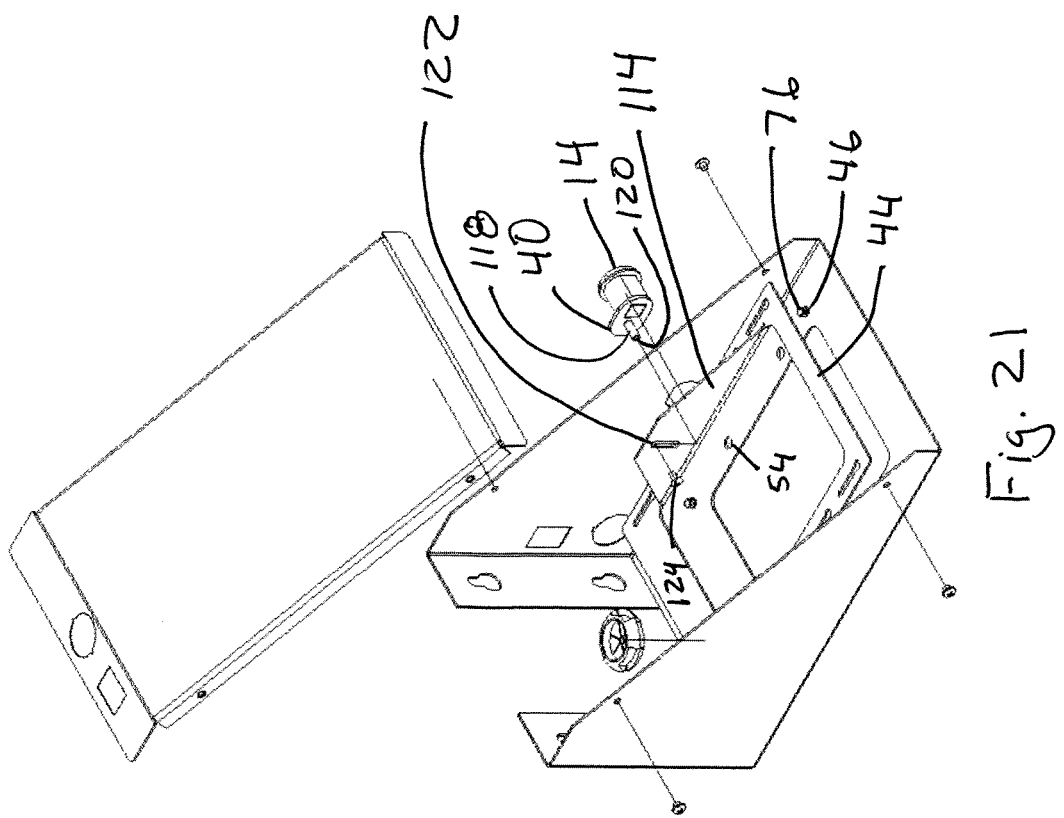
FIG. 21 is an exploded view of a wall embodiment according to the present invention.

FIGS. 17-38 show a wall embodiment of the present invention. FIGS. 17-19 show the assembled mounting system for walls. FIG. 18 shows a device 56 attached to the mounting system of FIG. 17. FIG. 19 shows the device 56 exploded away from the mounting system. FIGS. 20-21 show exploded views depicting the components of the wall embodiment. The wall embodiment includes a base 92, lock plate 44, lock 14, cam plate 40 and cover plate 94. The base 92 as shown includes an outside surface 12 and an inside surface 18. The base 92 includes two sides 96 with wall mount flanges 98. The wall mount flanges 98 include screw hole 100 for mounting the base 92 to a wall or other surface. One of the sides 96 includes a lock opening 102 to receive and mount the lock 14 which receives a key 104. The sides 96 are shown with as a triangle shape to reduce the overall size of the wall embodiment, but could be other shapes, such as a rectangular shape. The cover plate 94 includes side flanges 106 and end flanges 108. The side flanges 106 fit over the sides 96 of the base 92. The first end flange 108 seals off the one end of the base 92. The second end flange 108 aids in sealing the base 92 off at the mounting flanges 98. The cover plate 94 can be screwed to the sides of the base using holes 110 in the side flanges 106 of the cover plate 94. Rivets can replace the screws 112 for more security after the base 92 is mounted to the wall using the wall mount flanges 98. The combination of the cover plate 94 and base 92 prevent direct access to the lock plate 44 and acts as a box shaped enclosure. The base 92 could also include four rectangular sides extending up from the base 92 instead of the wall flanges 98 and sides 96 to make a rectangular box shape with the cover plate 94 engaging the four sides.

Figure 22:
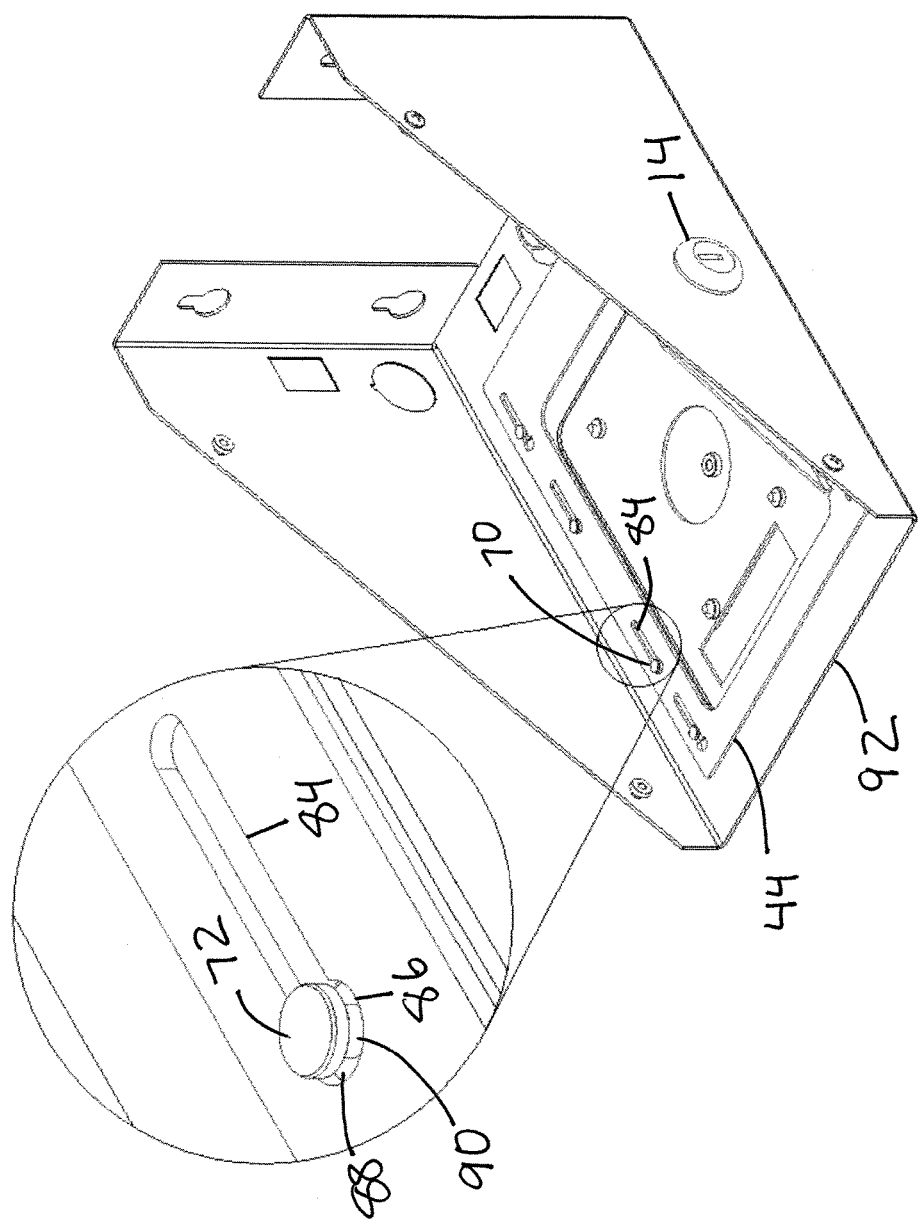
FIG. 22 is an inside perspective view of a wall embodiment according to the present invention.
Figure 23:
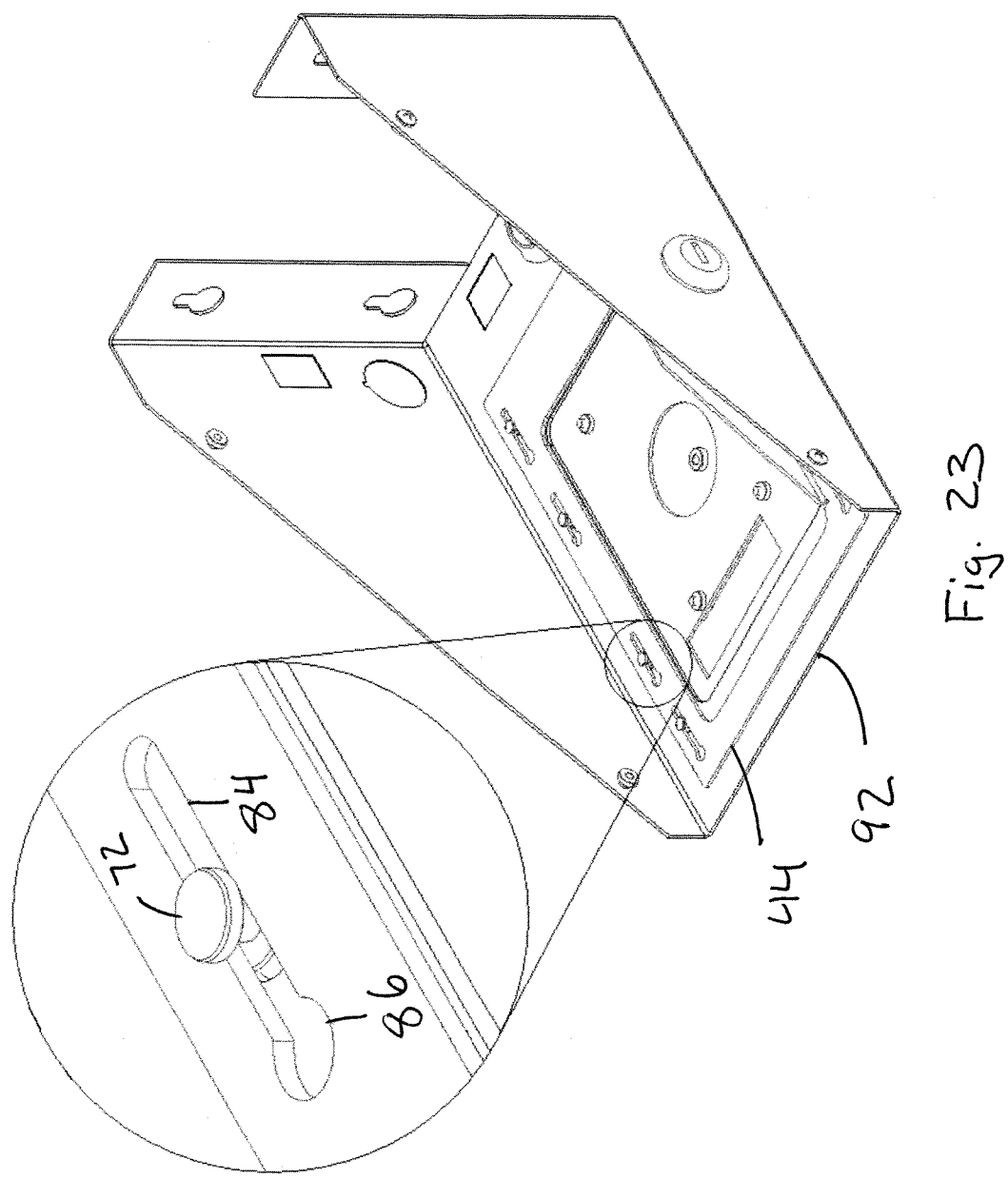
FIG. 23 is an inside perspective view of a wall embodiment according to the present invention.

The lock plate 44 includes guide slots 74, lock pin slots 84 and a lock flange 114. The base 92 includes guide pins 46 with guide pin heads 76 extending upward from the inside surface 18 of the base 92. The guide slots 74 of the lock plate 44 allow for the lock plate 44 to be slipped over the guide pins 46 at a head opening 78 of the guide slot 74 and held in position by the guide pins 46 so the lock plate 44 can move forward and rearward along the guide pins 46. The guide pins 46 include a shoulder 80 and guide shaft 82 similar to the ones of the ceiling embodiment. The device 56 that is to be mounted to the wall embodiment is attached to the same device receiver plate 58 shown in FIGS. 6-9 of the ceiling embodiment. FIG. 19 shows the device 56 attached to the device receiver plate 58 and exploded away from the base 92. The device receiver plate 58 is the same as shown in FIGS. 6-7, which show the device side 60 of the device receiver plate 58. FIGS. 8-9 show the lock plate side 62 of the device receiver plate 58. FIGS. 20-21 show lock holes 54 in the base 92. FIG. 22 shows the lock pins 70 extending up into the base 92 and through the head holes 86 of the lock pin slots 84. FIG. 23 shows the lock plate 44 after it has been move forward toward the locked position, where the lock pins slots 84 have engaged and captured the lock pin heads 72 of the lock pins 70. The lock pins 70 include a shoulder 88 and guide shaft 90 similar to the ones of the ceiling embodiment.

Figure 24:
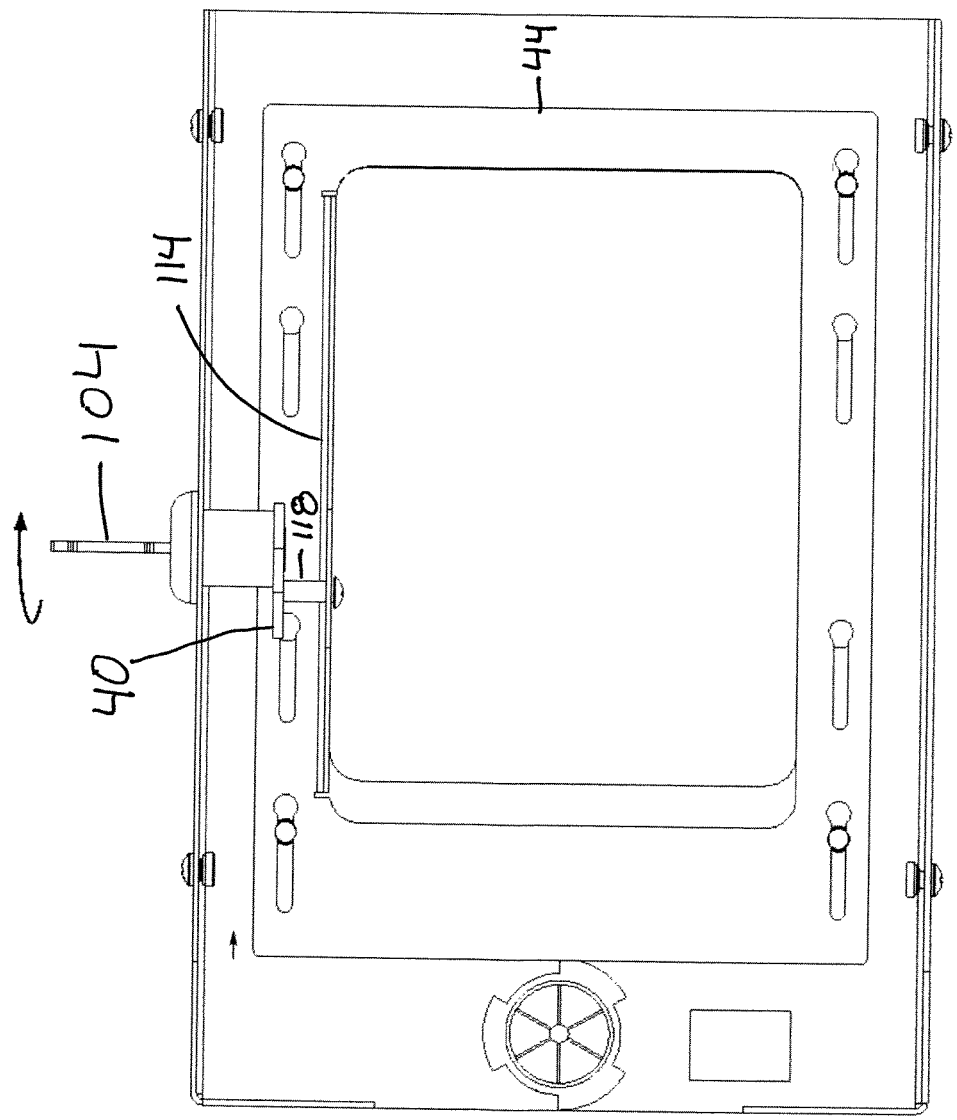
FIG. 24 is a top inside view of a wall embodiment according to the present invention.
Figure 25:
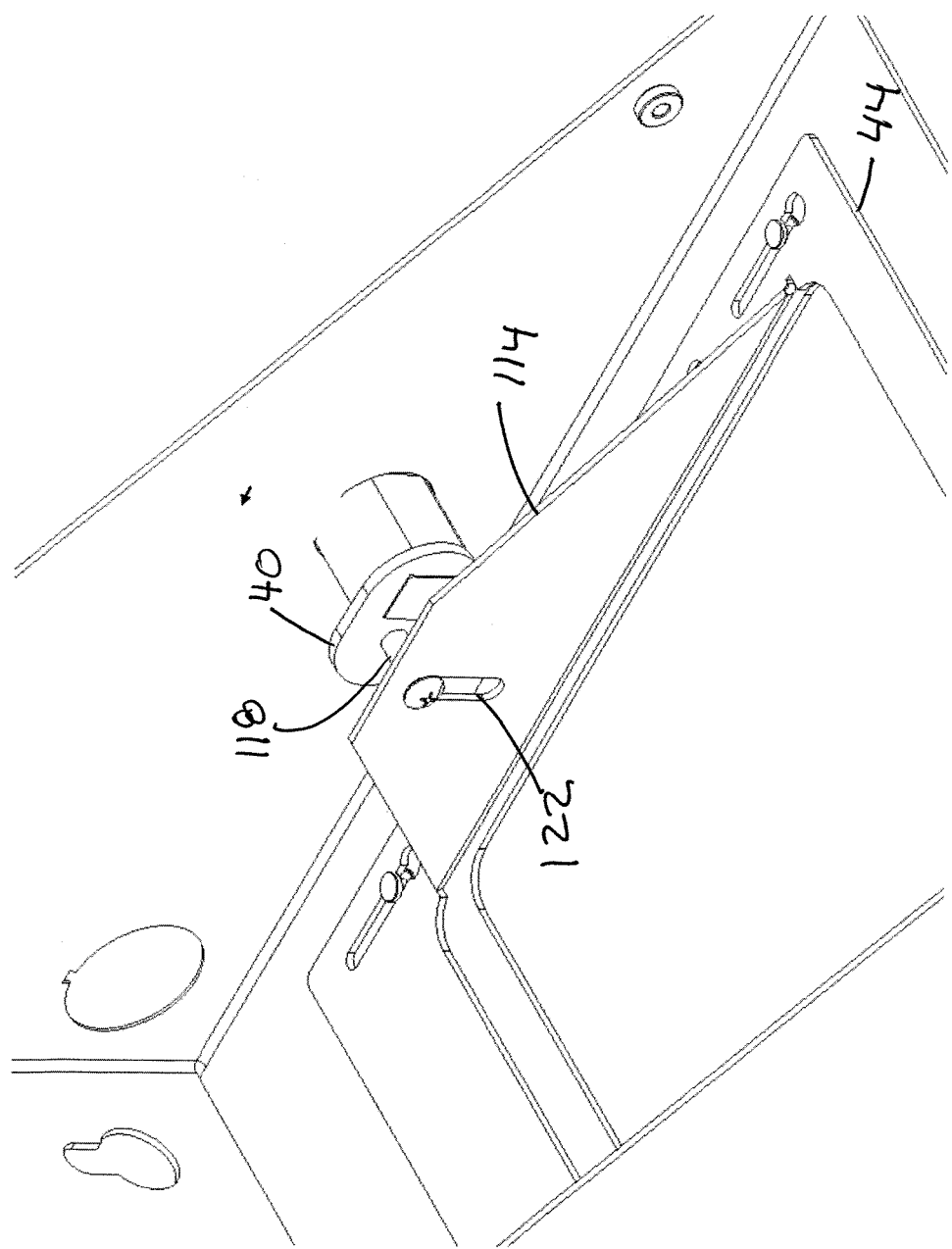
FIG. 25 is an inside partial perspective view of a wall embodiment according to the present invention.
Figure 26:
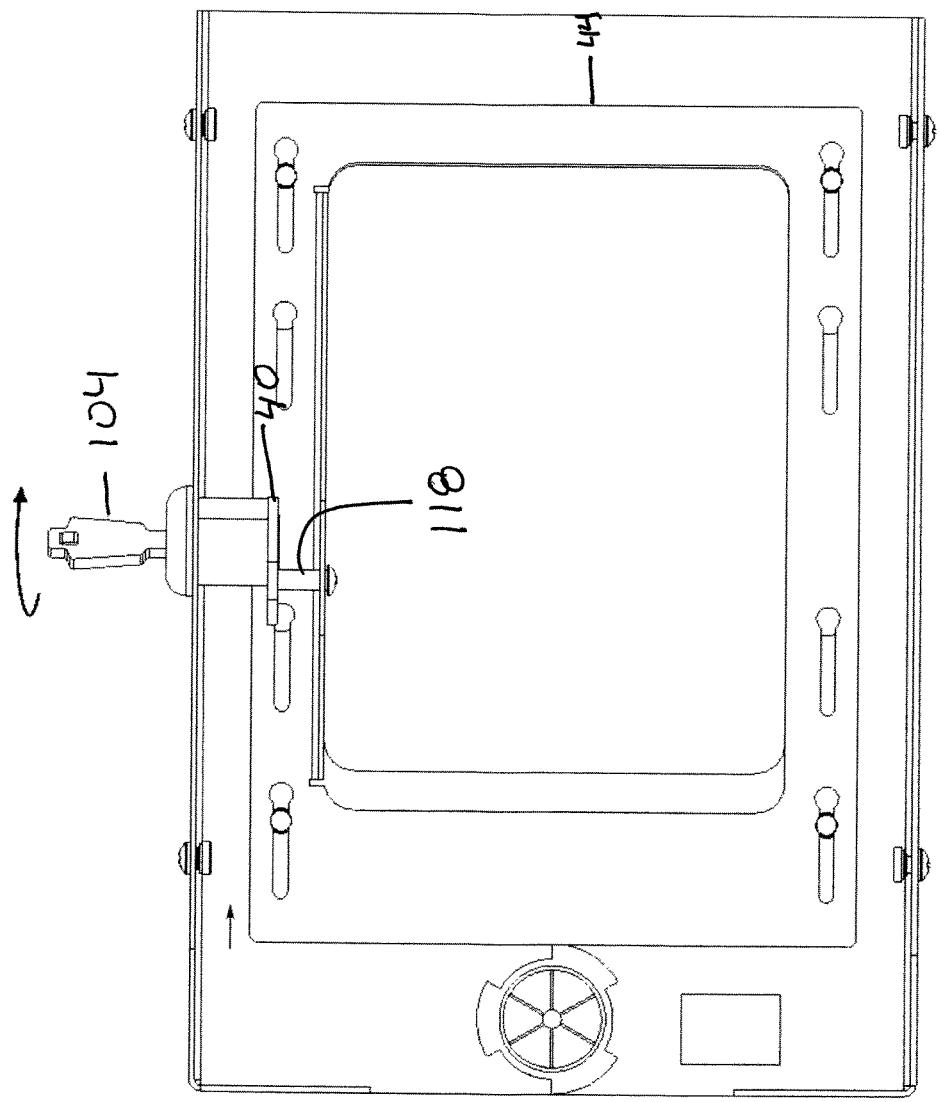
FIG. 26 is a top inside view of a wall embodiment according to the present invention.
Figure 27:
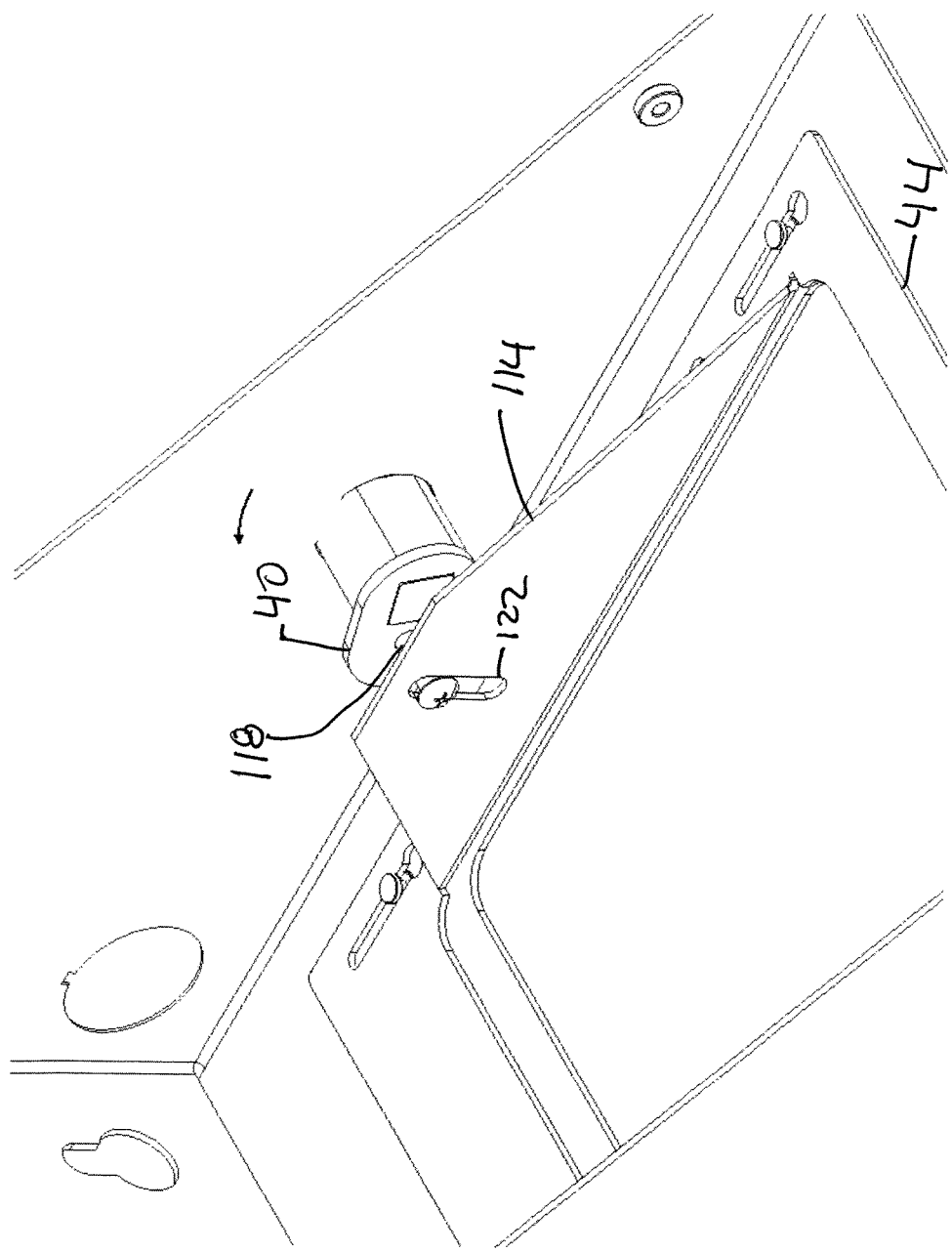
FIG. 27 is an inside partial perspective view of a wall embodiment according to the present invention.
Figure 28:
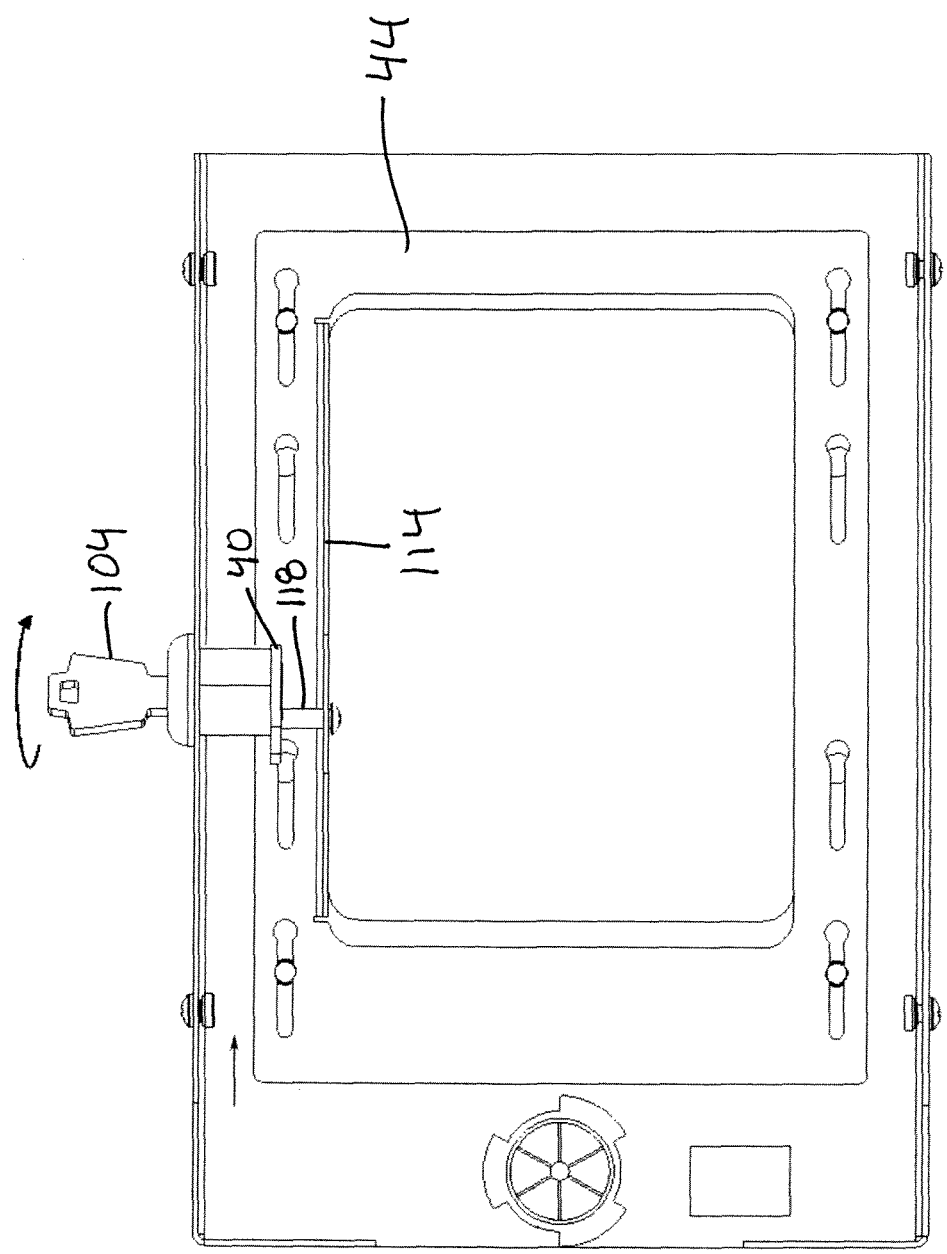
FIG. 28 is a top inside view of a wall embodiment according to the present invention.
Figure 29:
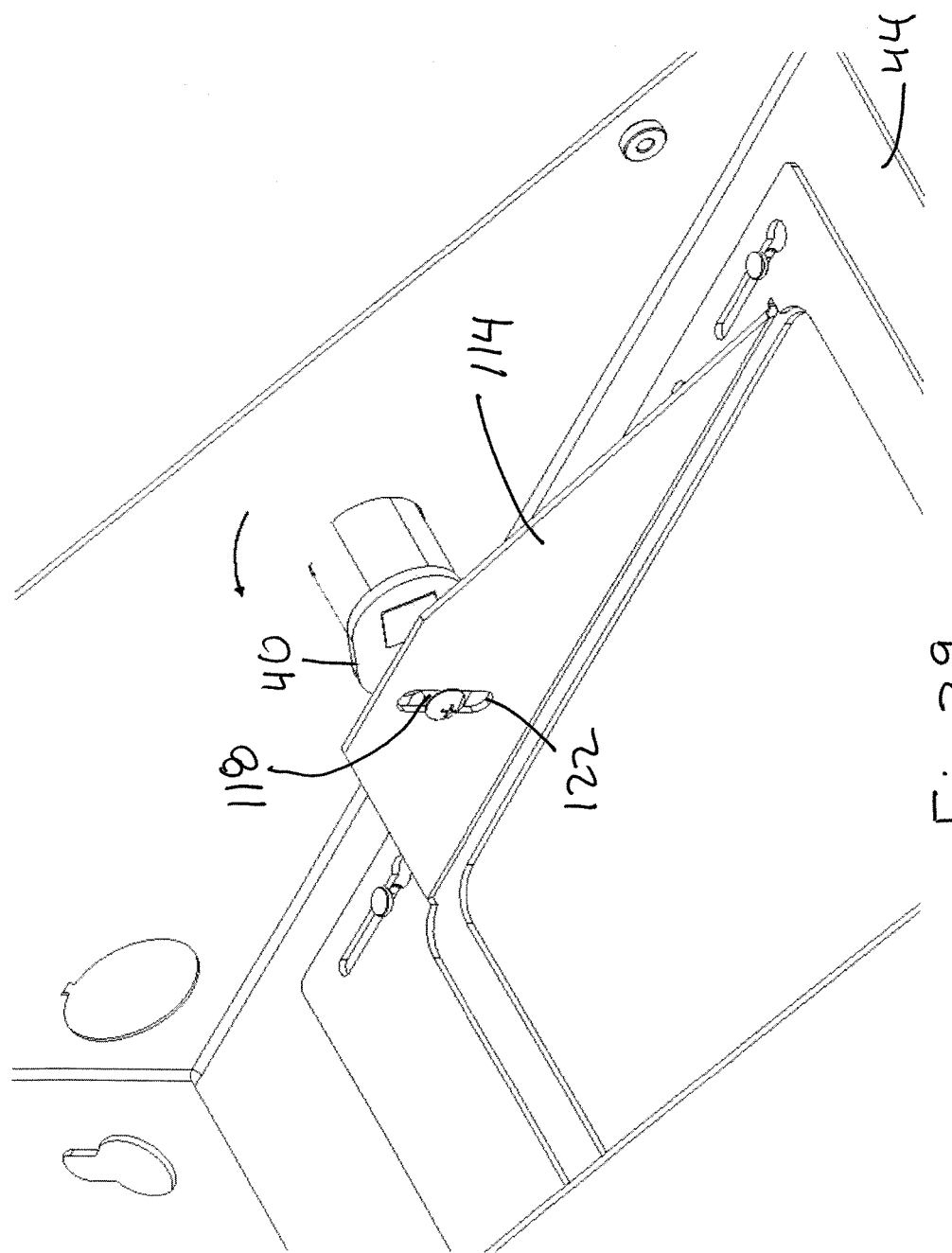
FIG. 29 is an inside partial perspective view of a wall embodiment according to the present invention.
Figure 30:
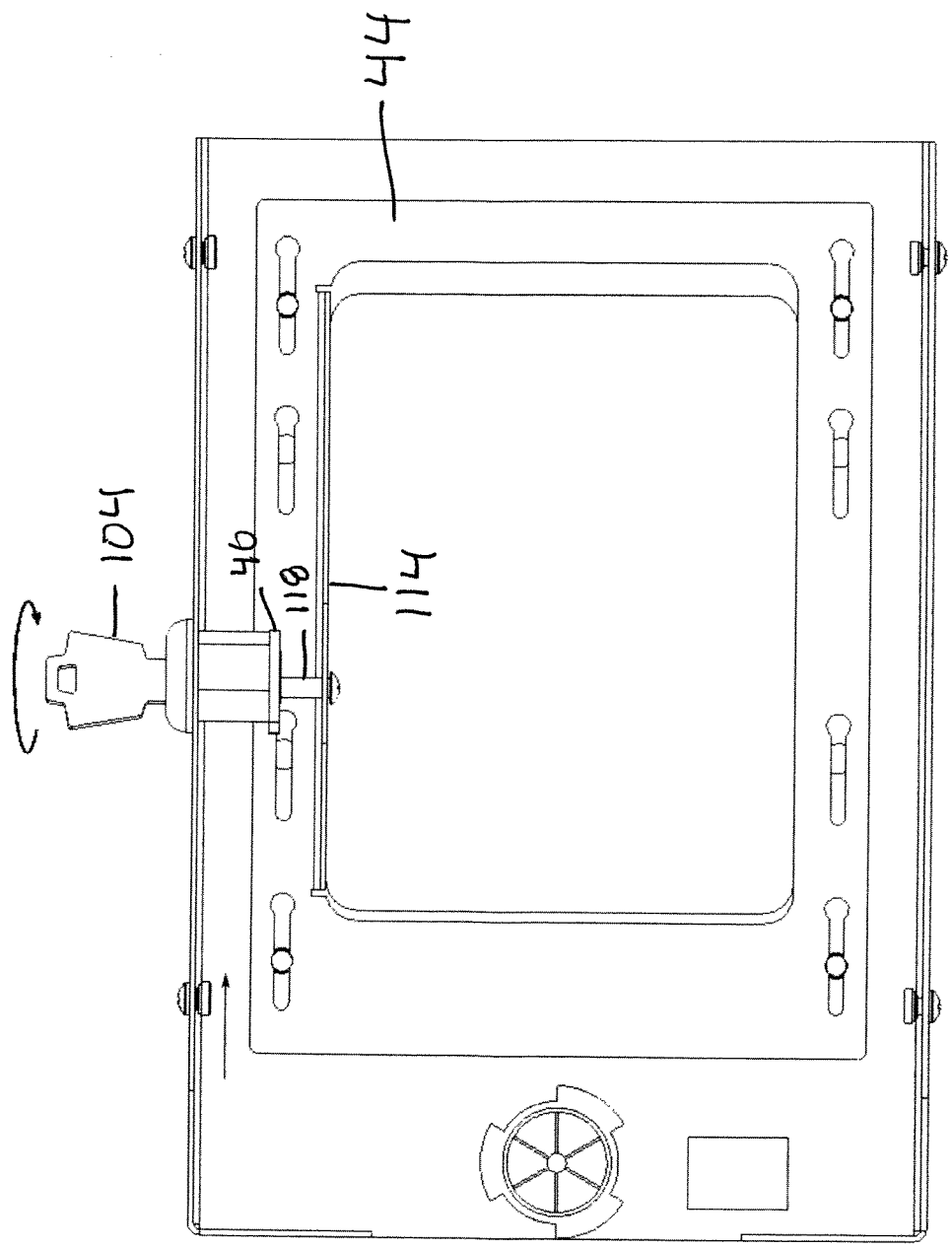
FIG. 30 is a top inside view of a wall embodiment according to the present invention.
Figure 31:
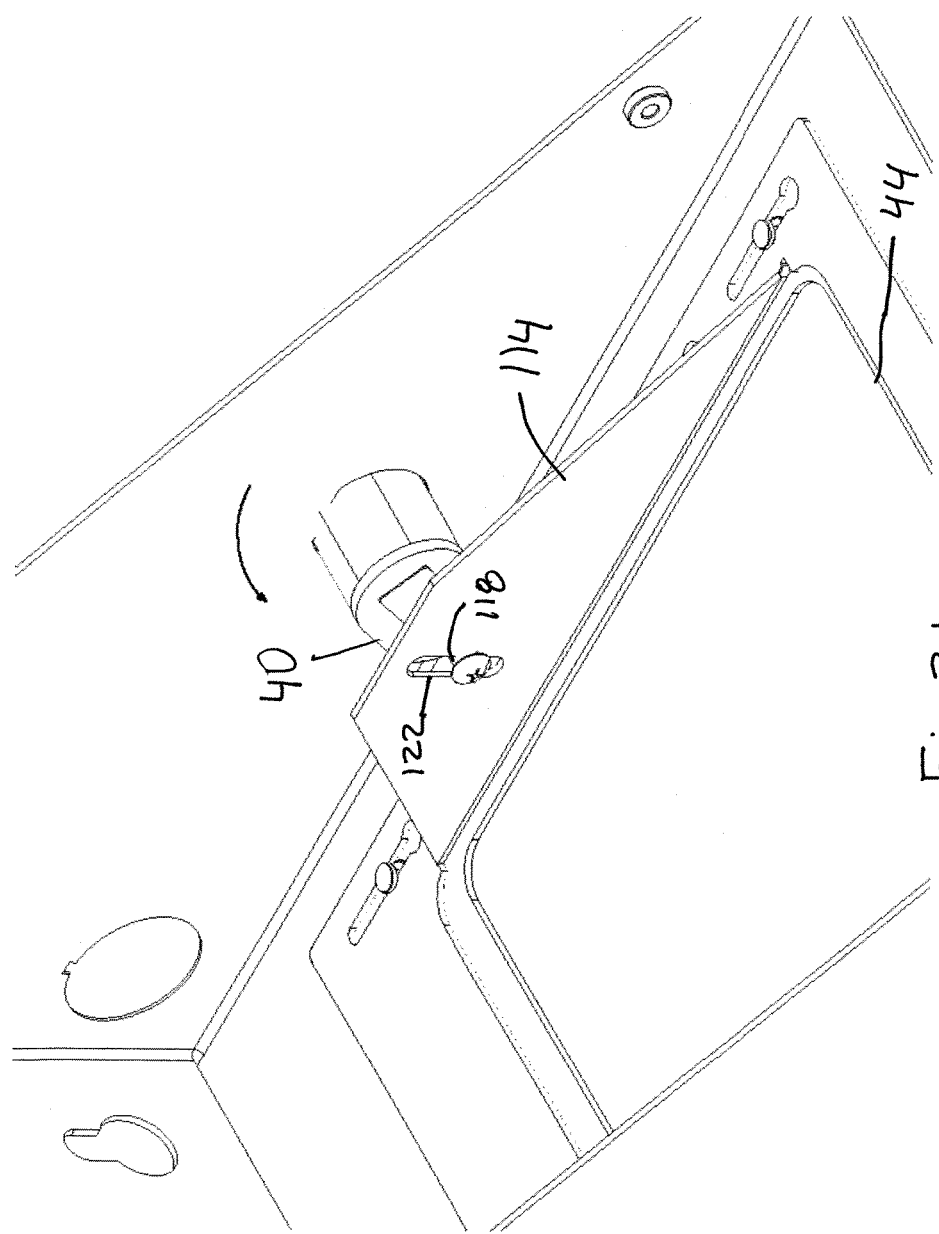
FIG. 31 is an inside partial perspective view of a wall embodiment according to the present invention.
Figure 32:
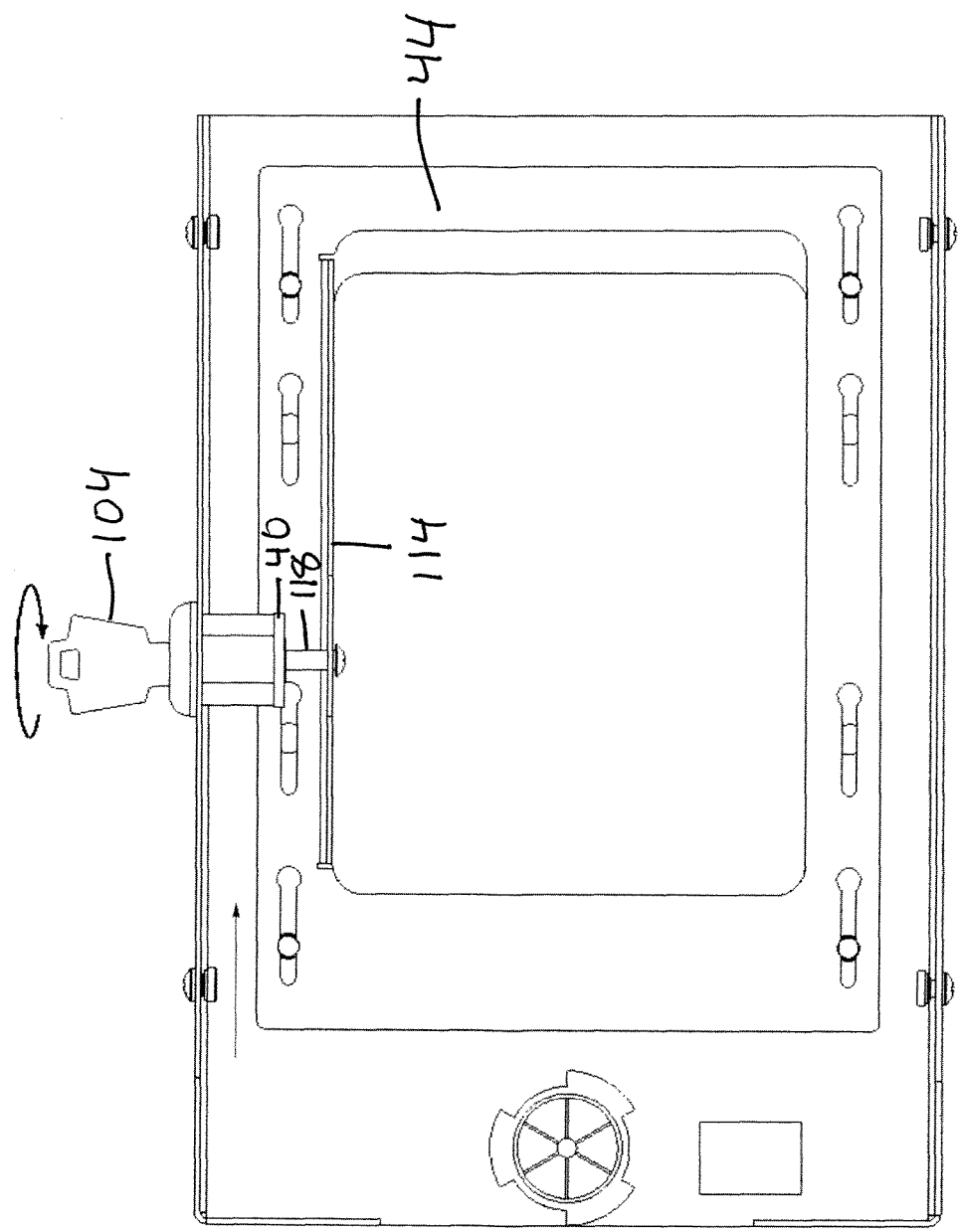
FIG. 32 is a top inside view of a wall embodiment according to the present invention.
Figure 33:
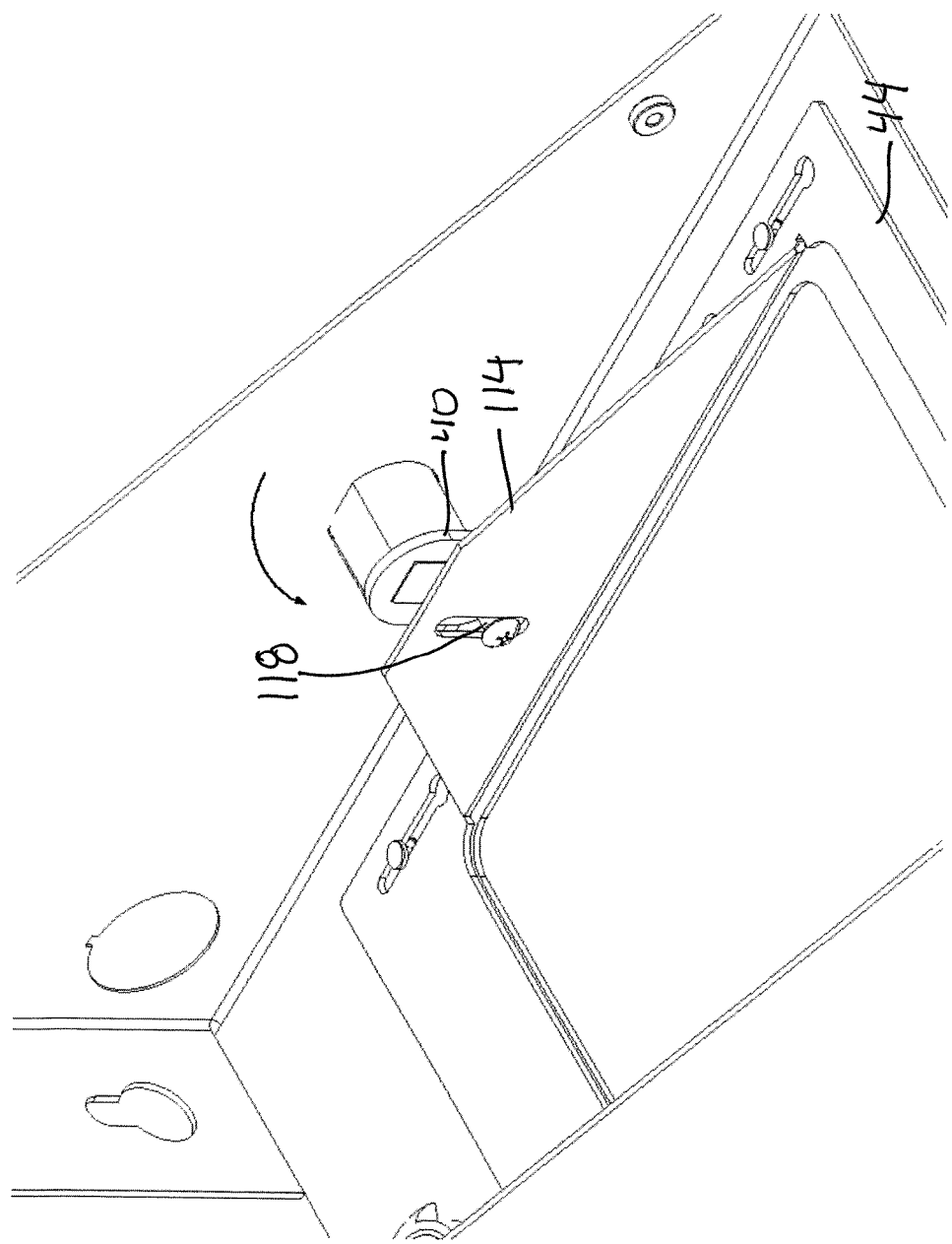
FIG. 33 is an inside partial perspective view of a wall embodiment according to the present invention.

FIGS. 20-21 show the lock 14 as a key receiver, which is shown as a lock cylinder 116 that receives a key 104. A cam plate 40 is connected to the lock cylinder 116, which turns when the key 104 is turned. The cam plate 40 includes a cam shaft 118 extending from the cam plate 40. Together the lock cylinder 116, cam plate 40 and cam shaft 118 act as a lock plate actuator. The cam shaft 118 includes a screw hole 120. When the lock 14 is assembled, the cam shaft 118 enters a shaft slot 122 in the lock flange 114. A screw 124 screwed into the screw hole 120 from the opposite side of the lock flange 114 to secure the engagement of the cam shaft 118 and the shaft slot 122. The lock flange 114 extends upward from one of the sides of the lock plate 44 that is parallel to the direction of movement of the lock plate 44 along the guide pins 46. The shaft slot 122 in the lock flange 144 is shown perpendicular to the direction of movement of the lock plate 44 along the guide pins 46. FIGS. 24-33 show the progression of locking the device 56 to the mounting system of the wall embodiment. FIGS. 24-25 show views of the initial key 104 movement. The key 104 is turned so that the cam plate 40 moves the cam shaft 118 in the downward direction in the shaft slot 122. FIGS. 26-31 show the cam shaft 118 continually moving downward in the shaft slot 122. As the cam shaft 118 moves downward along the shaft slot 122, the cam shaft 118 forces the lock flange 114 and along with it the lock plate 44 to move forward. As the lock plate 44 moves forward, the lock pin slots 84 engage and hold the lock pin heads 72 of the lock pins 70 so that the device 56 cannot be removed. FIGS. 32-33 show the final resting place of the lock plate 44 and lock cam plate 40 when the key 104 can be removed and the device 56 cannot be removed without the key 104. To remove the device 56, simply use the key 10 to turn the cam plate 40 in the opposite direction to disengage the lock pins 70 from the lock plate 44.

While different embodiments of the invention have been described in detail herein, it will be appreciated by those skilled in the art that various modifications and alternatives to the embodiments could be developed in light of the overall teachings of the disclosure. Accordingly, the particular arrangements are illustrative only and are not limiting as to the scope of the invention that is to be given the full breadth of any and all equivalents thereof.

We claim:

1. A mounting system for securing a device, comprising:
a base, said base having an inside surface and an outside surface, at least one lock hole which leads from said outside surface to said inside surface, and said base adapted to be mounted in a location;
at least one guide pin mounted to and extending out from said base;
a lock plate mounted in relation to said base such that said lock plate moves along said inside surface of said base, said lock plate including at least one guide slot and at least one lock slot, each of said at least one guide slot engaging each of said at least one guide pin to guide movement of said lock plate along said inside surface of said base, each of said lock slot aligning with one of said lock hole of said base;

a lock plate actuator connected to said lock plate to move said lock plate along said at least one guide pin, said lock plate actuator having access to be manipulated from the outside surface of said base;

a device receiver plate having a device side and a lock plate side, said device side adapted for mounting to a device so that the device can be secured to said mounting system;

at least one lock pin extending from said lock plate side of said device receiver plate, each of said at least one lock pin being long enough to pass through one of said lock hole of said base and engage one of said lock slot when said lock plate side of said device receiver plate is mounted against said outside surface of said base; and said lock slot movable along said lock pin during movement of said lock plate along said guide pin such that movement in one direction of the lock plate by said lock plate actuator secures said device receiver plate to said outside surface of said base and movement of said lock plate along said guide pin in another direction allows for attachment and release of said device receiver plate at said outside surface of said base; wherein said lock plate includes a lock flange extending away from one side of said lock plate that is parallel to movement directions of said lock plate, said lock flange including a shaft slot, wherein said lock plate actuator includes a cam and a cam shaft extending from said cam, said cam shaft engaging said shaft slot such that said cam shaft freely moves along said shaft slot to move said lock plate.

2. The mounting system of claim 1, wherein said lock plate actuator includes a key receiver adapted to accept and use a key to manipulate said lock plate actuator.

3. The mounting system of claim 1, wherein said lock plate includes two cam tabs such that said cam tabs are positioned opposite each other, and wherein said lock plate actuator includes a cam plate which fits between said cam tabs such that the lock plate moves in one of said directions when said cam plate engages one of said cam tabs due to rotation of said cam plate.

4. The mounting system of claim 1, further including a screw attached to an end of said cam shaft, such that said screw projects through said shaft slot and secures said cam shaft in said shaft slot.

5. The mounting system of claim 1, wherein said base is a ceiling tile and is used as a ceiling tile replacement.

6. The mounting system of claim 1, wherein said base is a bottom of a secure box shaped enclosure having at least three sides extending upward from said base and a top.

7. The mounting system of claim 6, wherein said box shaped enclosure is a secure cover enclosing said at least one guide pin, said a lock plate and said lock plate actuator.

8. The mounting system of claim 1, wherein said shaft slot is perpendicular to said movement directions of said lock plate.

9. The mounting system of claim 1, further including a secure cover enclosing said at least one guide pin, said a lock plate and said lock plate actuator.

10. The mounting system of claim 1, wherein each of said at least one guide slot includes a head opening at one end of said guide slot, wherein each of said at least one guide pin includes a guide pin head which passes through said head opening of said guide slot and is larger then said guide slot such that said guide pin head will retain said lock plate to only move in said directions of movement.

11. The mounting system of claim 10, wherein said each of said at least one guide pin includes a shoulder for said lock plate to ride on during movement.

12. The mounting system of claim 1, wherein each of said at least one lock slot includes a head opening at one end of said lock slot, wherein each of said at least one lock pin includes a lock pin head which passes through said head opening of said lock slot and is larger then said lock slot such that said lock pin head will retain said device receiver plate in place when said lock pin engages said lock slot beyond said head opening in said lock slot.

13. The mounting system of claim 12, wherein said each of said at least one lock pin includes a shoulder for said lock plate to ride on during movement.

14. The mounting system of claim 1, further including a device mount attached to said device side of said device receiver plate and wherein said device mount is adapted for mounting of the device.

15. The mounting system of claim 1, further a wire opening in said base and said lock plate adapted to allow wiring to pass from the device and through said base and said lock plate.

* * * * *